United States Patent
Yamashita

(10) Patent No.: US 7,858,289 B2
(45) Date of Patent: Dec. 28, 2010

(54) POSITIVE RESIST COMPOSITION FOR ELECTRON BEAM, X-RAY OR EUV AND PATTERN FORMING METHOD USING THE SAME

(75) Inventor: Katsuhiro Yamashita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/259,056

(22) Filed: Oct. 27, 2008

(65) Prior Publication Data

US 2009/0111047 A1    Apr. 30, 2009

(30) Foreign Application Priority Data

Oct. 26, 2007    (JP) ............................. 2007-279579

(51) Int. Cl.
*G03F 7/00* (2006.01)
*G03F 7/004* (2006.01)
*G03F 7/029* (2006.01)
*C07C 381/00* (2006.01)

(52) U.S. Cl. ...................... 430/270.1; 430/913; 568/19; 568/28

(58) Field of Classification Search .................. None
See application file for complete search history.

(56) References Cited

U.S. PATENT DOCUMENTS

| | | | |
|---|---|---|---|
| 6,033,826 A * | 3/2000 | Urano et al. ............. | 430/270.1 |
| 6,210,859 B1 * | 4/2001 | Jeon et al. ................ | 430/270.1 |
| 6,384,169 B1 * | 5/2002 | Watanabe et al. ........... | 526/346 |
| 7,449,573 B2 * | 11/2008 | Kodama et al. ............ | 540/482 |
| 2006/0210922 A1 * | 9/2006 | Nishiyama ............... | 430/270.1 |
| 2008/0102407 A1 * | 5/2008 | Ohsawa et al. ........... | 430/286.1 |
| 2009/0075202 A1 * | 3/2009 | Kodama et al. .......... | 430/285.1 |

FOREIGN PATENT DOCUMENTS

| | | | |
|---|---|---|---|
| EP | 1500977 A1 * | 1/2005 | |
| EP | 1703322 A2 * | 9/2006 | |
| JP | 6-242606 A | 9/1994 | |
| JP | 2001-107707 A | 4/2001 | |
| JP | 2001-166474 A | 6/2001 | |
| JP | 2001-166478 A | 6/2001 | |
| JP | 2001-194792 A | 7/2001 | |
| JP | 2003-107708 A | 4/2003 | |
| JP | 2005-234434 A | 9/2005 | |
| JP | 2006-208781 A | 8/2006 | |
| JP | 2007-210904 A | 8/2007 | |

* cited by examiner

*Primary Examiner*—Amanda C. Walke
(74) *Attorney, Agent, or Firm*—Sughrue Mion, PLLC

(57) ABSTRACT

A positive resist composition for electron beam, X-ray or EUV includes a compound having a proton acceptor functional group and capable of producing an acid radical upon irradiation with an actinic ray or radiation to reduce or lose the acceptor property or to change the proton acceptor functional group to be acidic, wherein the positive resist composition has a solid content concentration of from 2.5 to 4.5 mass %.

13 Claims, No Drawings

POSITIVE RESIST COMPOSITION FOR ELECTRON BEAM, X-RAY OR EUV AND PATTERN FORMING METHOD USING THE SAME

BACKGROUND OF THE INVENTION

1. Field of the Invention

The present invention relates to a positive resist composition suitable for use in the ultramicrolithography process such as production of VLSI or a high-capacity microchip or in other photofabrication processes, and a pattern forming method using the same. More specifically, the present invention relates to a positive resist composition capable of forming a high-resolution pattern by using electron beam, X-ray or EUV and a pattern forming method using the same. That is, the present invention relates to a positive resist composition suitably usable for fine processing of a semiconductor device, where electron beam, X-ray or EUV light is used, and a pattern forming method using the same.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV is proceeding.

The lithography using electron beam or EUV is positioned as a next-generation or next-next-generation pattern formation technique, and development of a positive resist is proceeding.

In the actual field of semiconductor fine processing, the aging stability of the resist composition is a problem. Usually, in producing VLSI or a high-capacity microchip, there is employed a system of preparing and storing only a resist composition in a large amount and step-by-step using a necessary amount of the resist therefrom at the semiconductor fine processing. However, the conventional resist composition for electron beam or EUV undergoes a change in sensitivity with aging and this requires to vary the exposure amount, development conditions and the like between when using a resist immediately after preparation and when using a resist at a later time after the preparation, which hampers mass production.

With respect to such a positive resist, there are conventionally known some resist compositions using a phenolic acid-decomposable resin obtained by copolymerizing an acid-decomposable acrylate monomer having an alicyclic group as the acid-decomposable group. Examples thereof include positive resist compositions disclosed in U.S. Pat. No. 5,561, 194, JP-A-2001-166474 (the term "JP-A" as used herein means an "unexamined published Japanese patent application"), JP-A-2001-166478, JP-A-2003-107708, JP-A-2001-194792 and JP-A-2005-234434. Also, a case using a compound capable of generating a sulfonic acid upon irradiation with an actinic ray or radiation and a compound capable of generating a carboxylic acid is disclosed in JP-A-2001-107707. Furthermore, a case using a photodecomposable base is disclosed in JP-A-6-242606, JP-A-2006-208781 and JP-A-2007-210904.

In these resist compositions using a low-molecular phenol compound as the main component, high dissolution contrast may be obtained but, on the other hand, there is a problem in the aging stability and the like.

SUMMARY OF THE INVENTION

An object of the present invention is to provide, in the fine processing of a semiconductor device by using electron beam, X-ray or EUV, a positive resist composition with good aging stability and a pattern forming method using the composition.

The present invention is as follows.

(1) A positive resist composition for electron beam, X-ray or EUV, comprising:
a compound having a proton acceptor functional group and capable of producing an acid radical upon irradiation with an actinic ray or radiation to reduce or lose the acceptor property or to change the proton acceptor functional group to be acidic,
wherein
the positive resist composition has a solid content concentration of from 2.5 to 4.5 mass %.

(2) The positive resist composition for electron beam, X-ray or EUV as described in (1), wherein
said compound is a compound capable of generating an organic acid represented by the following formula (I) upon irradiation with an actinic ray or radiation:

$$HO_3S\text{-}A\text{-}(X)_n\text{—}B\text{—}R \qquad (I)$$

wherein
A represents a divalent linking group,
X represents —$SO_2$— or —CO—,
n represents 0 or 1,
B represents a single bond, an oxygen atom or —N(Rx)-,
Rx represents a hydrogen atom or a monovalent organic group,
R represents a monovalent organic group containing a proton acceptor functional group, or a monovalent organic group containing an ammonium group, and
when B is —N(Rx)-, R and Rx may combine to form a ring.

(3) The positive resist composition for electron beam, X-ray or EUV as described in (1) or (2), further comprising:
a resin capable of decomposing by the action of an acid to increase the solubility in an alkali developer.

(4) A pattern forming method comprising:
forming a resist film from the positive resist composition described in any one of (1) to (3),
exposing said resist film with an electron beam, X-ray or EUV, and
developing said resist film.

DETAILED DESCRIPTION OF THE INVENTION

The present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Compound having a proton acceptor functional group and capable of producing an acid radical upon irradiation with an actinic ray or radiation to reduce or lose the acceptor property or to change the proton acceptor functional group to be acidic The positive resist composition of the present invention contains a compound having a proton acceptor functional group and capable of producing an acid radical upon irradiation with an actinic ray or radiation to reduce or lose the acceptor property or to change the proton acceptor functional group to be acidic (hereinafter sometimes referred to as a "compound (A)").

The compound (A) is preferably a compound capable of generating an organic acid represented by the following formula (I) upon irradiation with an actinic ray or radiation:

HO$_3$S-A-(X)$_n$—B—R    (I)

wherein A represents a divalent linking group,

X represents —SO$_2$— or —CO—, n represents 0 or 1,

B represents a single bond, an oxygen atom or —N(Rx)-,

Rx represents a hydrogen atom or a monovalent organic group,

R represents a monovalent organic group containing a proton acceptor functional group, or a monovalent organic group containing an ammonium group, and when B is —N(Rx)-, R and Rx may combine to form a ring.

The divalent linking group as A is a divalent linking group having a carbon number of 2 to 12, and examples thereof include an alkylene group and a phenylene group. The divalent linking group is preferably an alkylene or phenylene having no fluorine atom, more preferably an alkylene having no fluorine atom, but the alkylene group may have a fluorine atom within the range not impairing the effects of the present invention or the performance of the resist. The carbon number is preferably from 2 to 6, more preferably from 2 to 4. The alkylene chain may contain a linking group such as oxygen atom and sulfur atom.

The monovalent organic group as Rx is preferably a monovalent organic group having a carbon number of 4 to 30, and examples thereof include an alkyl group, a cycloalkyl group, an aryl group, an aralkyl group and an alkenyl group.

The alkyl group as Rx, which may have a substituent, is preferably a linear or branched alkyl group having a carbon number of 1 to 20 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent includes particularly a group where a cycloalkyl group is substituted to a linear or branched alkyl group, such as adamantylmethyl group, adamantylmethyl group, cyclohexylethyl group and camphor residue.

The cycloalkyl group as Rx, which may have a substituent, is preferably a cycloalkyl group having a carbon number of 3 to 20 and may contain an oxygen atom in the ring. Specific examples thereof include a cyclopropyl group, a cyclopentyl group, a cyclohexyl group, a norbornyl group and an adamantyl group.

The aryl group as Rx, which may have a substituent, is preferably an aryl group having a carbon number of 6 to 14, and examples thereof include a phenyl group and a naphthyl group.

The aralkyl group as Rx, which may have a substituent, is preferably an aralkyl group having a carbon number of 7 to 20, and examples thereof include a benzyl group, a phenethyl group, a naphthylmethyl group and a naphthylethyl group.

The alkenyl group as Rx, which may have a substituent, includes, for example, a group having a double bond at an arbitrary position of the alkyl group described as Rx.

R represents a monovalent organic group containing a proton acceptor functional group, or a monovalent organic group containing an ammonium group. The proton acceptor functional group is a functional group having a group or electron capable of electrostatically interacting with a proton and indicates, for example, a functional group having a macrocyclic structure such as cyclic polyether or a functional group containing a nitrogen atom having a lone electron pair not contributing to π-conjugation. The nitrogen atom having a lone electron pair not contributing to π-conjugation is, for example, a nitrogen atom having a partial structure represented by either one of the following formulae:

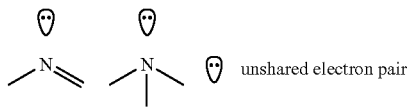

Preferred examples of the partial structure of the proton acceptor functional group include crown ether, aza-crown ether, tertiary amine, secondary amine, primary amine, pyridine, imidazole and pyrazine structures. Preferred examples of the partial structure of the ammonium group include tertiary ammonium, secondary ammonium, primary ammonium, pyridinium, imidazolinium and pyrazinium structures. The group containing such a structure preferably has a carbon number of 4 to 30, and examples thereof include an alkyl group, a cycloalkyl group, an aryl group, an aralkyl group and an alkenyl group.

The alkyl group, cycloalkyl group, aryl group, aralkyl group and alkenyl group in the alkyl group, cycloalkyl group, aryl group, aralkyl group or alkenyl group as R containing a proton acceptor functional group or an ammonium group are the same as the alkyl group, cycloalkyl group, aryl group, aralkyl group and alkenyl group described for Rx.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include one or two alkyl groups (preferably having a carbon number of 1 to 20).

When B is —N(Rx)-, R and Rx preferably combine to form a ring. By forming a ring structure, the stability is enhanced and the storage stability of the composition using this compound increases. The number of carbons constituting the ring is preferably from 4 to 20, and the ring may be monocyclic or polycyclic and may contain an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or three or more monocyclic structures. The monocyclic structure and polycyclic structure each may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

The organic acid represented by formula (I) can be synthesized using a general sulfonamidation reaction. For example, this compound can be obtained by a method of selectively reacting one sulfonyl halide moiety of a bis-sulfonyl halide compound with an amine compound to form a sulfonamide bond, and then hydrolyzing the other sulfonyl halide moiety, or a method of ring-opening a cyclic sulfonic anhydride through reaction with an amine compound.

Specific preferred examples of the organic acid represented by formula (I) are set forth below, but the present invention is not limited thereto.

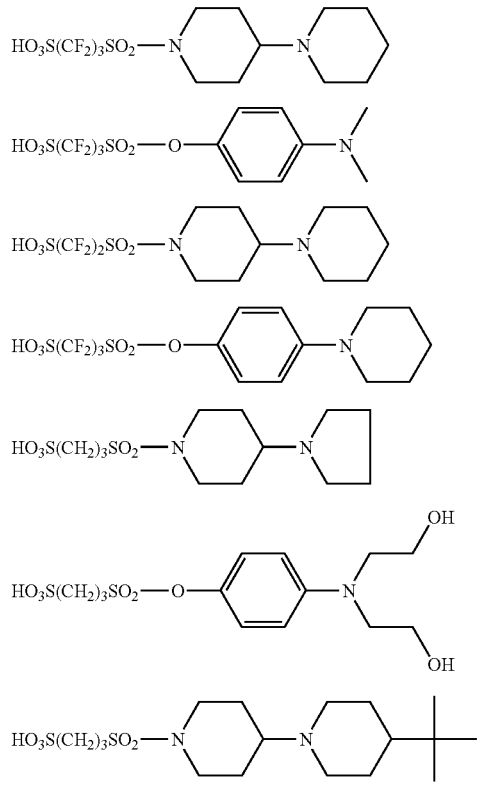

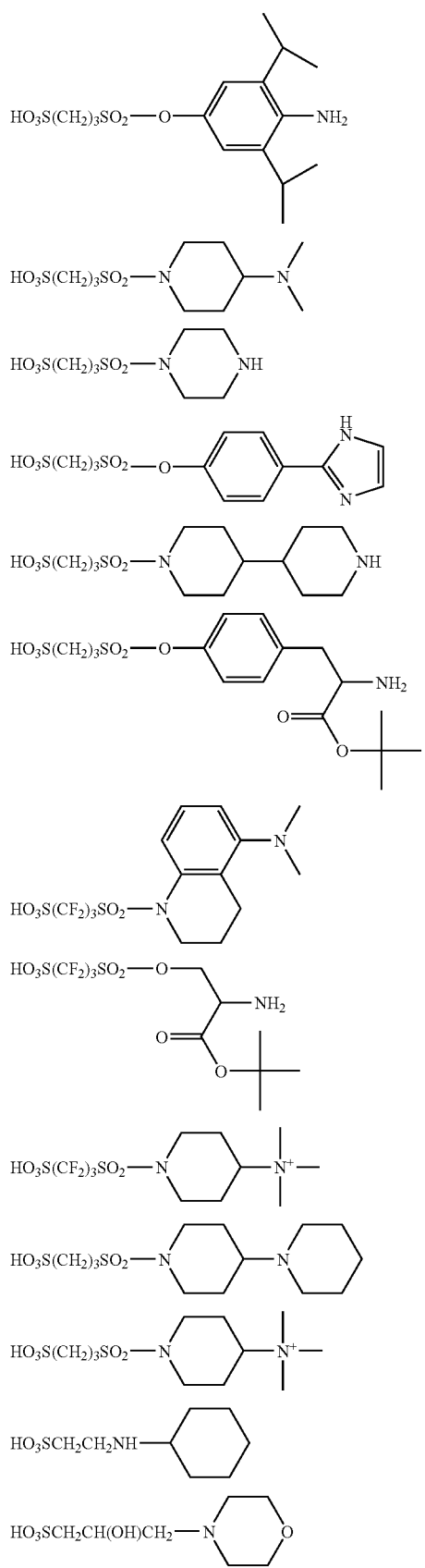

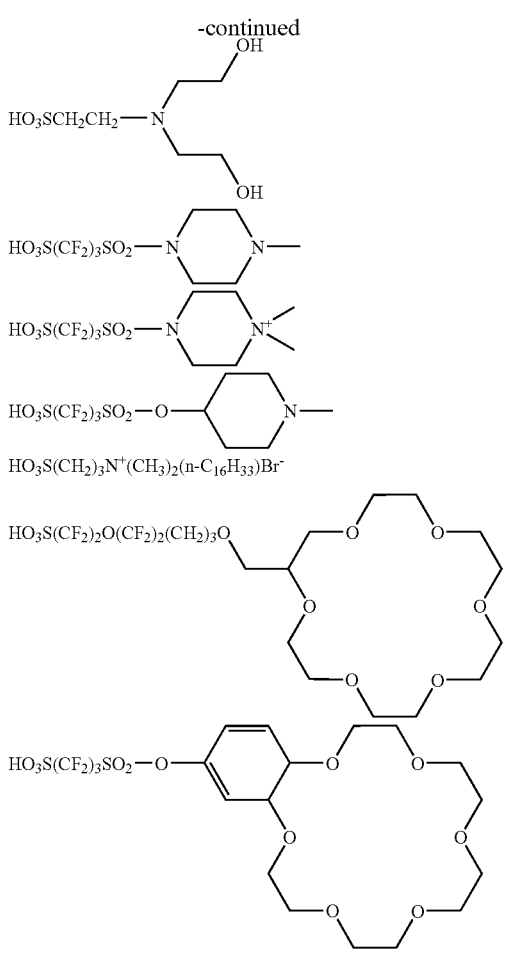

The compound capable of generating an organic acid represented by formula (I) upon irradiation with an actinic ray or radiation is preferably a sulfonium salt compound of the organic acid represented by formula (I), or an iodonium salt compound of the organic acid represented by formula (I), more preferably a compound represented by the following formula (A1) or (A2):

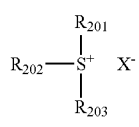

(A1)

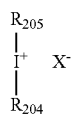

(A2)

In formula (A1), each of $R_{201}$, $R_{202}$ and $R_{203}$ independently represents an organic group.

$X^-$ represents a sulfonate anion where the hydrogen atom in the —$SO_3H$ moiety of the organic acid represented by formula (I) is deprived of.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amido bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include the corresponding groups in the compounds (A1a), (A1b) and (A1c) described later.

The compound may be a compound having a plurality of structures represented by formula (A1). For example, the compound may be a compound having a structure where at least one of $R_{201}$ to $R_{203}$ in the compound represented by formula (A1) is bonded to at least one of $R_{201}$ to $R_{203}$ in another compound represented by formula (A1).

The component (A1) is more preferably a compound (A1a), (A1b) or (A1c) described below.

The compound (A1a) is an arylsulfonium compound where at least one of $R_{201}$ to $R_{203}$ in formula (A1) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, a diarylcycloalkylsulfonium compound, an aryldialkylsulfonium compound, an aryldicycloalkylsulfonium compound and an arylalkylcycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (A1b) is described below.

The compound (A1b) is a compound when each of $R_{201}$ to $R_{203}$ in formula (A1) independently represents an organic group having no aromatic ring. The aromatic ring as used herein includes an aromatic ring having a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group having a carbon number of 1 to 20 (e.g., methyl, ethyl, propyl, butyl, pentyl). The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10 (e.g., cyclopentyl, cyclohexyl, norbornyl). The cycloalkyl group as $R_{201}$ to $R_{203}$ is more preferably a 2-oxocycloalkyl group.

The linear or branched 2-oxoalkyl group as $R_{201}$ to $R_{203}$ may have a double bond in the chain and is preferably a group having $>C=O$ at the 2-position of the alkyl group above.

The 2-oxocycloalkyl group as $R_{201}$ to $R_{203}$ may have a double bond in the chain and is preferably a group having $>C=O$ at the 2-position of the cycloalkyl group above.

The alkoxy group in the alkoxycarbonylmethyl group as $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), an alkoxycarbonyl group (for example, an alkoxycarbonyl group having a carbon number of 1 to 5), a hydroxyl group, a cyano group or a nitro group.

The compound (A1c) is a compound represented by the following formula (A1c), and this is a compound having an arylacylsulfonium salt structure.

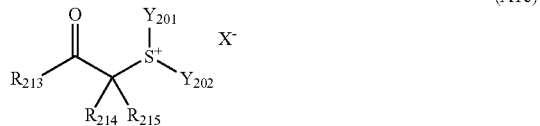

(A1c)

In formula (A1c), $R_{213}$ represents an aryl group which may have a substituent, and is preferably a phenyl group or a naphthyl group.

Preferred examples of the substituent on $R_{213}$ include an alkyl group, an alkoxy group, an acyl group, a nitro group, a hydroxyl group, an alkoxycarbonyl group and a carboxy group.

Each of $R_{214}$ and $R_{215}$ independently represents a hydrogen atom, an alkyl group or a cycloalkyl group.

Each of $Y_{201}$ and $Y_{202}$ independently represents an alkyl group, a cycloalkyl group, an aryl group or a vinyl group.

$X^-$ represents a sulfonate anion where the hydrogen atom in the $-SO_3H$ moiety of the organic acid represented by formula (I) is deprived of.

$R_{213}$ and $R_{214}$ may combine with each other to form a ring structure, $R_{214}$ and $R_{215}$ may combine with each other to form a ring structure, and $Y_{201}$ and $Y_{202}$ may combine with each other to form a ring structure. The ring structure formed may contain an oxygen atom, a sulfur atom, an ester bond or an amide bond. Examples of the group formed by combining each pair of $R_{213}$ and $R_{214}$, $R_{214}$ and $R_{215}$, or $Y_{201}$ and $Y_{202}$ include a butylene group and a pentylene group.

The alkyl group as $R_{214}$, $R_{215}$, $Y_{201}$ and $Y_{202}$ is preferably a linear or branched alkyl group having a carbon number of 1 to 20. The alkyl group as $Y_{201}$ and $Y_{202}$ is more preferably a 2-oxoalkyl group having $>C=O$ at the 2-position of the alkyl group, an alkoxycarbonylalkyl group (preferably with the alkoxy group having a carbon number of 2 to 20), or a carboxyalkyl group.

The cycloalkyl group as $R_{214}$, $R_{215}$, $Y_{201}$ and $Y_{202}$ is preferably a cycloalkyl group having a carbon number of 3 to 20.

$Y_{201}$ and $Y_{202}$ each is preferably an alkyl group having a carbon number of 4 or more, more preferably from 4 to 6, still more preferably from 4 to 12.

At least either one of $R_{214}$ and $R_{215}$ is preferably an alkyl group, and more preferably, $R_{214}$ and $R_{215}$ both are an alkyl group.

In formula (A2), each of $R_{204}$ and $R_{205}$ independently represents an aryl group, an alkyl group or a cycloalkyl group.

$X^-$ represents a sulfonate anion where the hydrogen atom in the $-SO_3H$ moiety of the organic acid represented by formula (I) is deprived of.

The aryl group of $R_{204}$ and $R_{205}$ is preferably a phenyl group or a naphthyl group, more preferably a phenyl group.

The alkyl group as $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group as $R_{204}$ and $R_{205}$ is preferably a cycloalkyl group having a carbon number of 3 to 10 (e.g., cyclopentyl, cyclohexyl, norbornyl).

$R_{204}$ and $R_{205}$ each may have a substituent, and examples of the substituent which $R_{204}$ and $R_{205}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

Also, the compound (A) is preferably a compound represented by the following formula (A3):

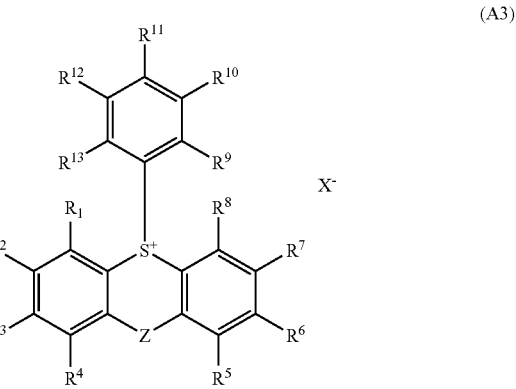

(A3)

In formula (A3), each of $R^1$ to $R^{13}$ independently represents a hydrogen atom or a substituent, and at least one of $R^1$ to $R^{13}$ is a substituent containing an alcoholic hydroxyl group.

Z represents a single bond or a divalent linking group.

X⁻ represents an anion containing a proton acceptor functional group and is preferably an anion of the organic acid represented by formula (I).

The alcoholic hydroxyl group in the invention indicates a hydroxyl group bonded to a carbon atom of an alkyl group.

In the case where $R^1$ to $R^{13}$ each is a substituent containing an alcoholic hydroxyl group, $R^1$ to $R^{13}$ each is represented by —W—Y, wherein Y is an alkyl group substituted by a hydroxyl group and W is a single bond or a divalent linking group.

Examples of the alkyl group of Y include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group. Among these, preferred are an ethyl group, a propyl group, an isopropyl group, an n-butyl group, an isobutyl group and a sec-butyl group, and more preferred are an ethyl group, a propyl group and an isopropyl group. In particular, Y preferably has a structure of —CH$_2$CH$_2$OH.

The divalent linking group represented by W is not particularly limited and includes a divalent group obtained by substituting a single bond for an arbitrary hydrogen atom of a monovalent group such as alkoxyl group, acyloxy group, carbamoyloxy group, alkoxycarbonyloxy group, aryloxycarbonyloxy group, acylamino group, aminocarbonylamino group, alkoxycarbonylamino group, aryloxycarbonylamino group, sulfamoylamino group, alkylsulfonylamino group, arylsulfonylamino group, alkylthio group, arylthio group, sulfamoyl group, alkylsulfinyl group, arylsulfinyl group, alkylsulfonyl group, arylsulfonyl group, acyl group, aryloxycarbonyl group, alkoxycarbonyl group and carbamoyl group.

W is preferably a single bond or a divalent group obtained by substituting a single bond for an arbitrary hydrogen atom of an alkoxyl group, an acyloxy group, an acylamino group, an alkylsulfonylamino group, an arylsulfonylamino group, an alkylthio group, an alkylsulfonyl group, an acyl group, an alkoxycarbonyl group or a carbamoyl group, more preferably a single bond or a divalent group obtained by substituting a single bond for an arbitrary hydrogen atom of an acyloxy group, an alkylsulfonyl group, an acyl group or an alkoxycarbonyl group.

In the case where $R^1$ to $R^{13}$ each is a substituent containing an alcoholic hydroxyl group, the number of carbon atoms contained is preferably from 2 to 10, more preferably from 2 to 6, still more preferably from 2 to 4.

The substituent containing an alcoholic hydroxyl group, as $R^1$ to $R^{13}$, may have two or more alcoholic hydroxyl groups. The number of alcoholic hydroxyl groups in the substituent containing an alcoholic hydroxyl group, as $R^1$ to $R^{13}$, is from 1 to 6, preferably from 1 to 3, more preferably 1.

The number of alcoholic hydroxyl groups in the compound represented by formula (A3) is, in total of $R^1$ to $R^{13}$, from 1 to 10, preferably from 1 to 6, more preferably from 1 to 3.

In the case where each of $R^1$ to $R^{13}$ does not contain an alcoholic hydroxyl group, each of $R^1$ to $R^{13}$ independently represents a hydrogen atom or a substituent, and the substituent may be any substituent and is not particularly limited, but examples thereof include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may be called a hetero ring group), a cyano group, a nitro group, a carboxyl group, an alkoxyl group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

Two adjacent members out of $R^1$ to $R^{13}$ may combine to form a ring (an aromatic or non-aromatic hydrocarbon ring or a hetero ring, which may be further combined to form a polycyclic condensed ring; e.g., benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring and phenazine ring).

In the case where each of $R^1$ to $R^{13}$ does not contain an alcoholic hydroxyl group, each of $R^1$ to $R^{13}$ is preferably a hydrogen atom, a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfonyl group, an aryloxycarbonyl group, an alkoxycarbonyl group, a carbamoyl group, an imido group, a silyl group, or a ureido group.

In the case where each of $R^1$ to $R^{13}$ does not contain an alcoholic hydroxyl group, each of $R^1$ to $R^{13}$ is more preferably a hydrogen atom, a halogen atom, an alkyl group (including a cycloalkyl group, a bicycloalkyl group and a tricycloalkyl group), a cyano group, an alkoxy group, an acyloxy group, an acylamino group, an aminocarbonylamino group, an alkoxycarbonylamino group, an alkylsulfonylamino group, an arylsulfonylamino group, an alkylthio group, a sulfamoyl group, an alkylsulfonyl group, an arylsulfonyl group, an alkoxycarbonyl group, or a carbamoyl group.

In the case where each of $R^1$ to $R^{13}$ does not contain an alcoholic hydroxyl group, $R^1$ to $R^{13}$ each is still more preferably a hydrogen atom, an alkyl group (including a cycloalkyl group, a bicycloalkyl group and a tricycloalkyl group), a halogen atom, or an alkoxy group.

In formula (A3), at least one of $R^1$ to $R^{13}$ contains an alcoholic hydroxyl group, and preferably, at least one of $R^9$ to $R^{13}$ contains an alcoholic hydroxyl group.

Z represents a single bond or a divalent linking group, and examples of the divalent linking group include an alkylene group, an arylene group, a carbonyl group, a sulfonyl group, a carbonyloxy group, a carbonylamino group, a sulfonamido group, an ether group, a thioether group, an amino group, a disulfide group, an acyl group, an alkylsulfonyl group, —CH=CH—, —C≡C—, an aminocarbonylamino group, and an aminosulfonylamino group, which groups each may have a substituent. Examples of this substituent are the same as those described for the substituent as $R^1$ to $R^{13}$. Z is preferably a single bond or a non-electron-withdrawing substituent such as alkylene group, arylene group, ether group, thioether group, amino group, —CH=CH—, —C≡C—, aminocarbonylamino group and aminosulfonylamino group, more preferably a single bond, an ether group or a thioether group, still more preferably a single bond.

The compound represented by formula (A3) has, as the counter anion $X^-$, a proton acceptor functional group-containing anion.

The anion is preferably an organic anion. The organic anion indicates an anion containing at least one carbon atom. The organic anion is preferably a non-nucleophilic anion. The non-nucleophilic anion is an anion having extremely low ability of causing a nucleophilic reaction and being capable of suppressing the decomposition with aging due to intramolecular nucleophilic reaction.

Examples of the non-nucleophilic anion include a sulfonate anion, a carboxylate anion, a sulfonylimide anion, a bis(alkylsulfonyl)imide anion and a tris(alkylsulfonyl)methyl anion.

Examples of the non-nucleophilic sulfonate anion include an alkylsulfonate anion, an arylsulfonate anion, and a camphorsulfonate anion. Examples of the non-nucleophilic carboxylate anion include an alkylcarboxylate anion, an arylcarboxylate anion, and an aralkylcarboxylate anion.

The alkyl moiety in the alkylsulfonate anion may be an alkyl group or a cycloalkyl group and is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group.

The aryl group in the arylsulfonate anion is preferably an aryl group having a carbon number of 6 to 14, such as phenyl group, tolyl group and naphthyl group.

Examples of the substituent for the alkyl group, cycloalkyl group and aryl group in the alkylsulfonate anion and arylsulfonate anion include a nitro group, a halogen atom (fluorine, chlorine, bromine, iodine), a carboxyl group, a hydroxyl group, an amino group, a cyano group, an alkoxyl group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or cyclic structure of each group, examples of the substituent further include an alkyl group (preferably having a carbon number of 1 to 15).

The alkyl moiety in the alkylcarboxylate anion is the same as the alkyl group or cycloalkyl group in the alkylsulfonate anion. The aryl group in the arylcarboxylate anion is the same as aryl group in the arylsulfonate anion. The aralkyl group in the aralkylcarboxylate anion is preferably an aralkyl group having a carbon number of 6 to 12, and examples thereof include a benzyl group, a phenethyl group, a naphthylmethyl group, a naphthylethyl group, and a naphthylmethyl group.

Examples of the substituent of the alkyl group, cycloalkyl group, aryl group and aralkyl group in the alkylcarboxylate anion, arylcarboxylate anion and aralkylcarboxylate anion include a halogen atom, an alkyl group, a cycloalkyl group, an alkoxyl group and an alkylthio group, which are the same as those in the arylsulfonate anion. Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group.

Other examples of the non-nucleophilic anion include fluorinated phosphorus, fluorinated boron and fluorinated antimony.

Examples of the proton acceptor functional group in the anion as $X^-$ are the same as those of R in formula (I), as mentioned above.

$X^-$ may be an anion of the acid represented by the following formula (IIa) or an anion represented by the following formula (IIIa):

Q-R                                                            (IIa)

In formula (IIa), Q represents a sulfo group (—SO$_3$H) or a carboxyl group (—CO$_2$H).

R represents a monovalent organic group containing a proton acceptor functional group.

Incidentally, the anion of the acid represented by formula (IIa) is an anion formed resulting from leaving of the hydrogen atom of a sulfo group or carboxyl group as Q.

In formula (IIIa), each of $R_1$ and $R_2$ represents a monovalent organic group, and either one contains a proton acceptor functional group. $R_1$ and $R_2$ may combine to form a ring, and the ring formed may have a proton acceptor functional group.

Each of $X_1$ and $X_2$ independently represents —CO— or —SO$_2$—.

In formula (IIIa), at least either one of $X_1$ and $X_2$ is preferably —SO$_2$—.

The anion represented by formula (IIIa) is preferably an anion represented by the following formula (IVa):

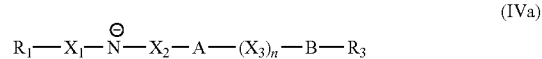

In formula (IVa), each of $R_1$ and $R_3$ independently represents a monovalent organic group, provided that either one of $R_1$ and $R_3$ has a proton acceptor functional group. $R_1$ and $R_3$ may combine to form a ring, and the ring formed may have a proton acceptor functional group.

Each of $X_1$, $X_2$ and $X_3$ independently represents —CO— or —SO$_2$—.

A represents a divalent linking group.

B represents a single bond, an oxygen atom or —N(Rx)-.

Rx represents a hydrogen atom or a monovalent organic group.

When B is —N(Rx)-, $R_3$ and Rx may combine to form a ring.

n represents 0 or 1.

The divalent linking group as A is preferably a fluorine atom-containing divalent linking group having a carbon number of 1 to 8, and examples thereof include a fluorine atom-containing alkylene group having a carbon number of 1 to 8 and a fluorine atom-containing phenylene group. A fluorine atom-containing alkylene group is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is substituted by a fluorine atom, more preferably a perfluoroalkylene group, still more preferably a perfluoroethylene group, a perfluoropropylene group, or a perfluorobutylene group.

The monovalent organic group as Rx is preferably an organic group having a carbon number of 4 to 30, and examples thereof include an alkyl group, a cycloalkyl group, an aryl group, an aralkyl group and an alkenyl group. The alkyl group, cycloalkyl group, aryl group, aralkyl group and alkenyl group are the same as those described above.

In formula (IIIa), each of $X_1$, $X_2$ and $X_3$ is preferably —SO$_2$—.

The molecular weight of the compound represented by formula (A3) is preferably from 200 to 2,000, more preferably from 400 to 1,000.

The compound represented by formula (A3) can be synthesized by the method described, for example, in JP-A-2007-210904, that is, a method of condensing a cyclic sulfoxide compound to a benzene derivative containing, as the substituent, a hydroxyl group protected with a protective group, thereby forming a sulfonium salt, and deprotecting the protective group of the hydroxyl group.

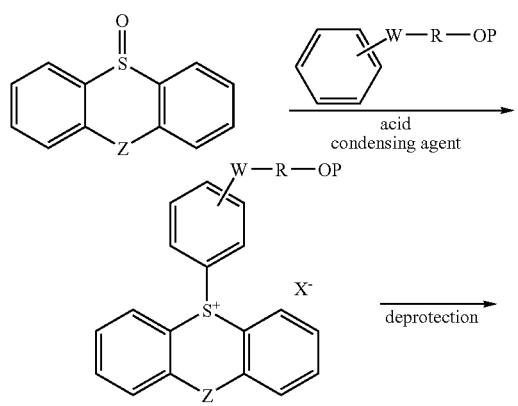

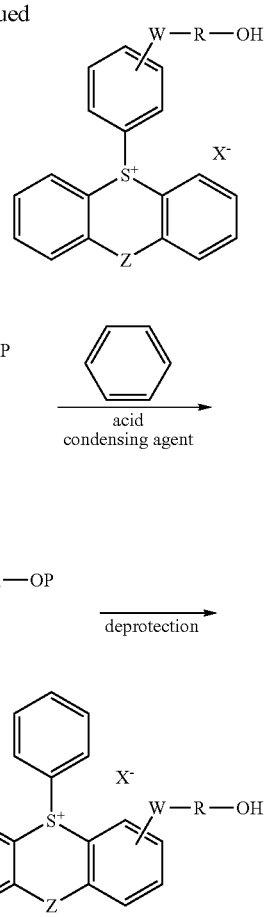

In the Figure above, W is a divalent linking group, R is an alkylene group, and P is a protective group.

The compound capable of generating an organic acid represented by formula (I) upon irradiation with an actinic ray or radiation is preferably a compound represented by formula (A1), more preferably a compound represented by formulae (A1a) to (A1c).

Examples of the compound having a proton acceptor functional group and producing a sulfonic acid group upon irradiation with an actinic ray or radiation to reduce or lose the acceptor property or to change the proton acceptor functional group to be acidic, for use in the present invention, include a compound where in the compound represented by formula (A1) or (A2), R in the organic acid represented by formula (I) for $X^-$ is a monovalent organic group containing a proton acceptor functional group.

In the present invention, reduction in the acceptor property means that when a noncovalent bond complex as a proton adduct is produced from a proton acceptor functional group-containing compound and a proton, the equilibrium constant at the chemical equilibrium decreases.

Specific examples of the compound having a proton acceptor functional group and producing a sulfonic acid group upon irradiation with an actinic ray or radiation to reduce or lose the acceptor property or to change the proton acceptor functional group to be acidic, and the compound capable of generating an organic acid represented by formula (I) upon irradiation with an actinic ray or radiation, are set forth below, but the present invention is not limited thereto.

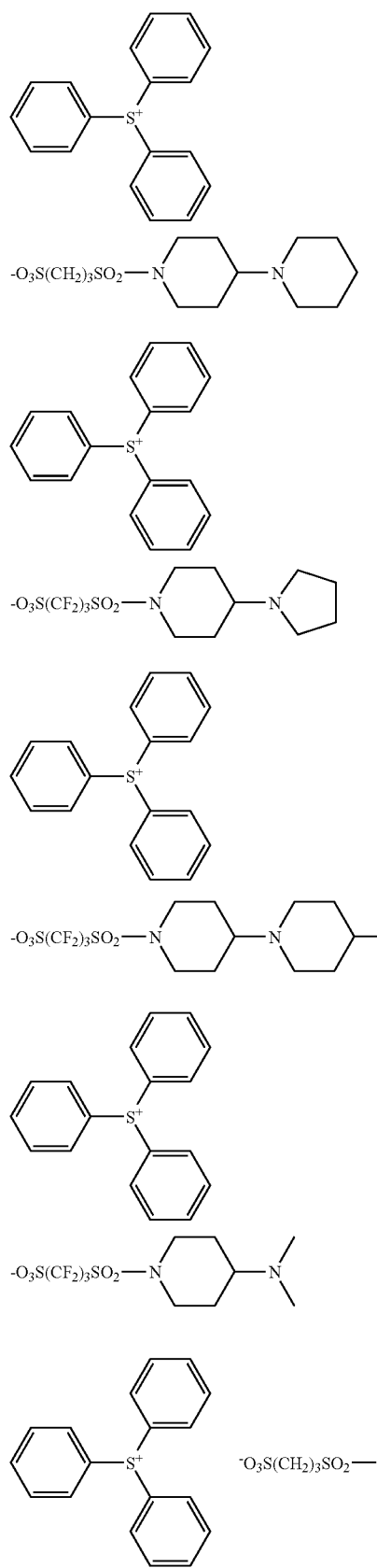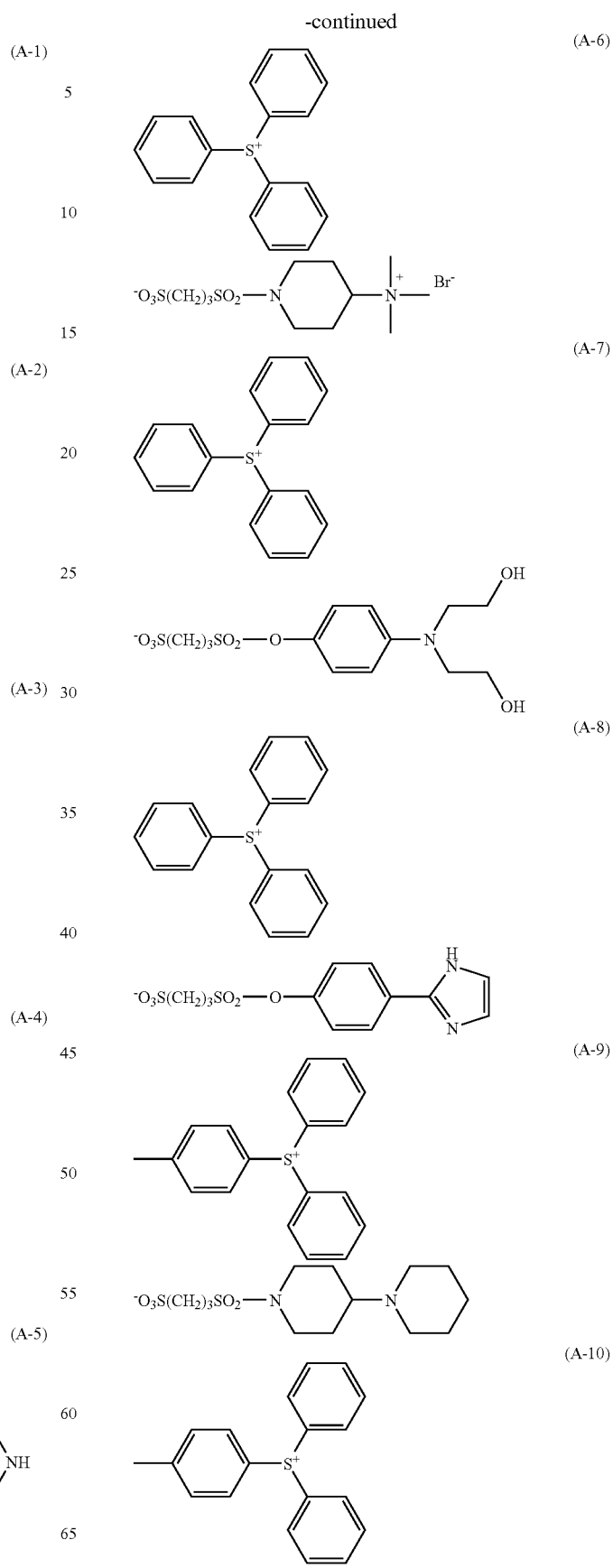

-continued
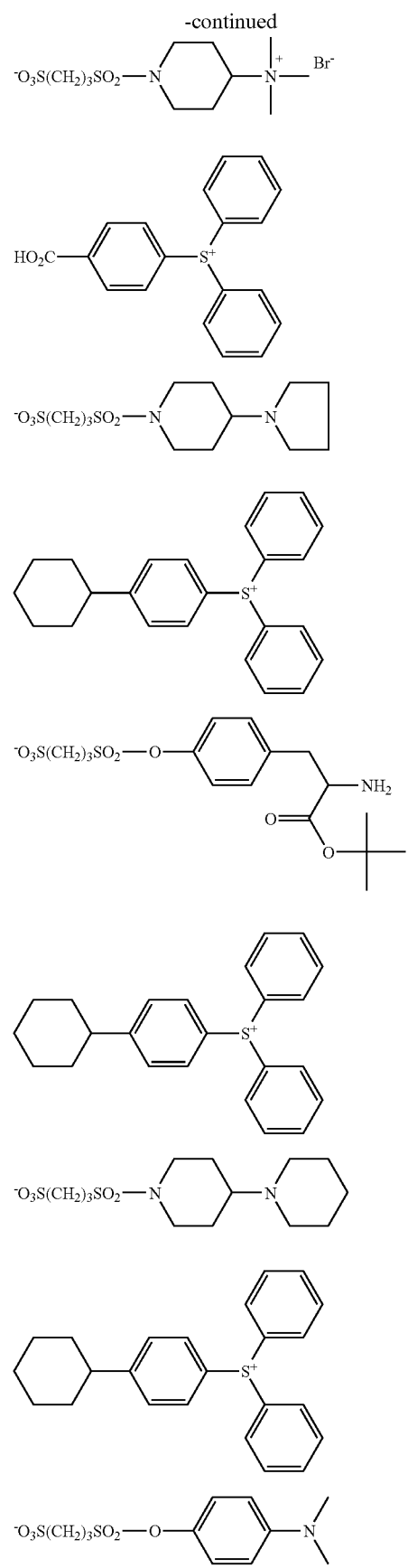
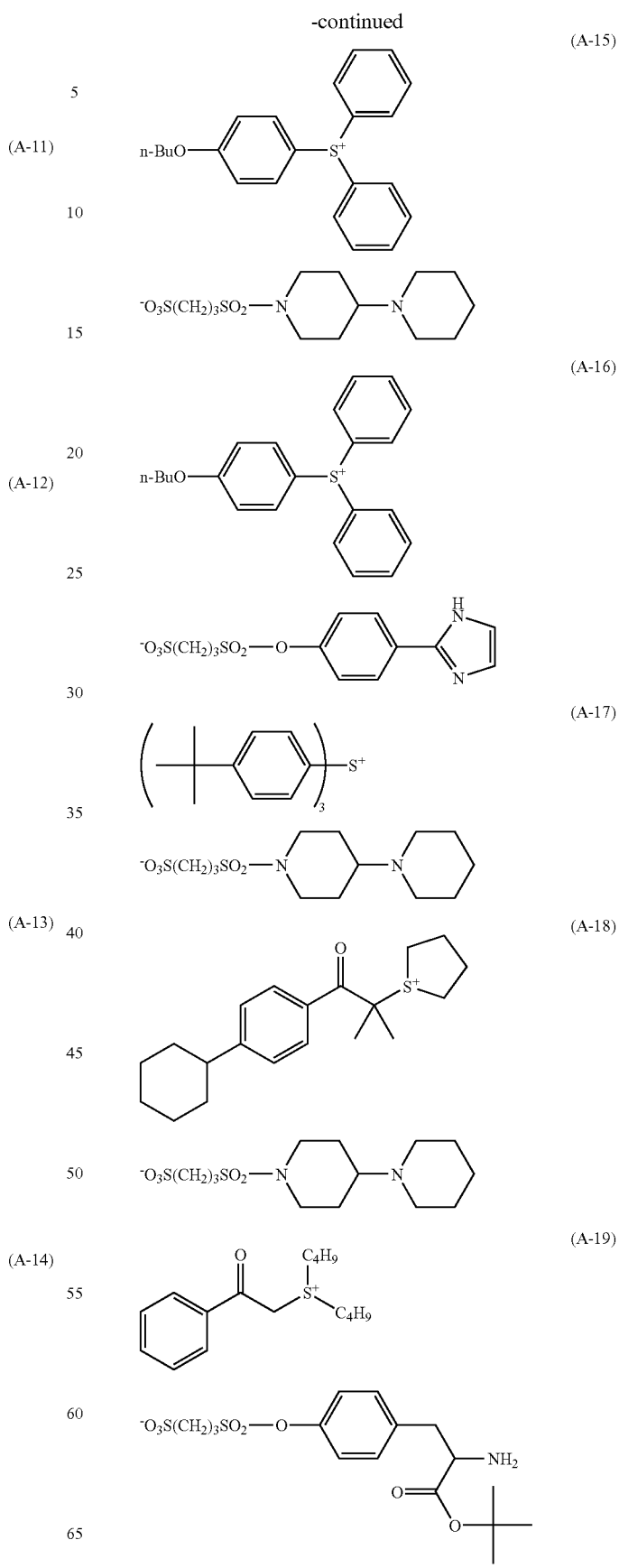

(A-20)
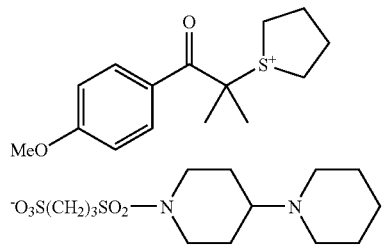
(A-21)
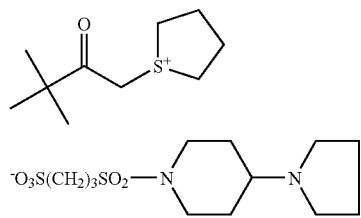
(A-22)
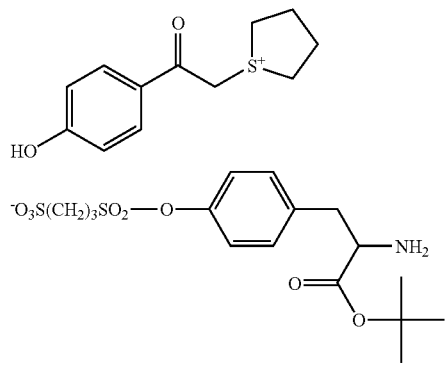
(A-23)
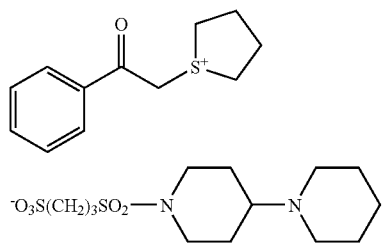
(A-24)
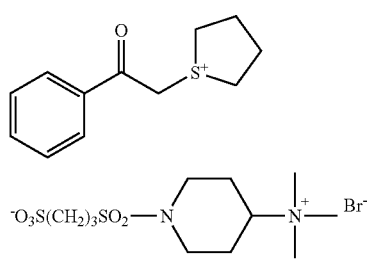
(A-25)
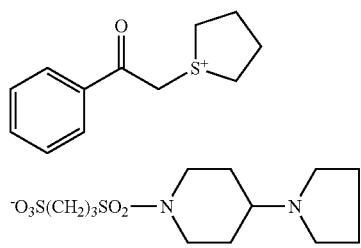
(A-26)
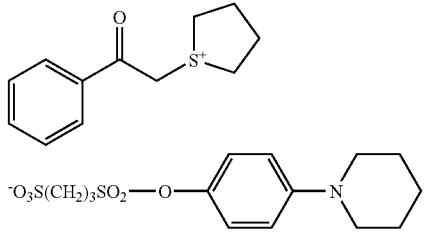
(A-27)
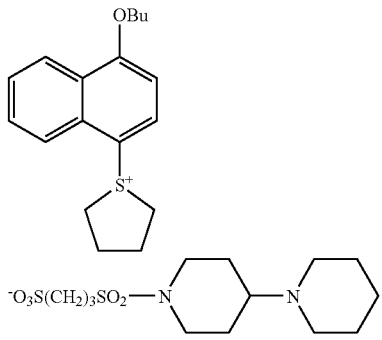
(A-28)
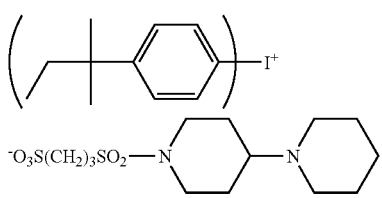
(A-29)
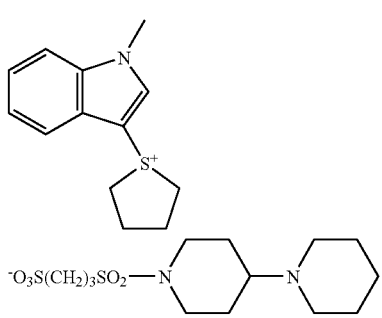
(A-30)
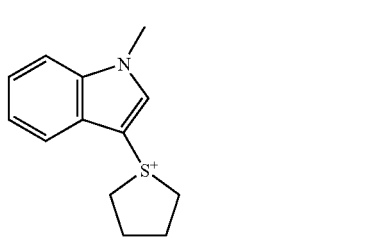
(A-31)
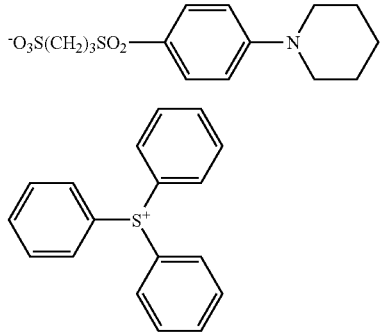

-continued

-continued
(A-43)
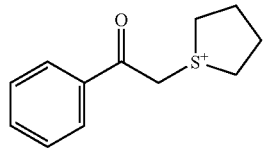
⁻O₃S(CH₂)₃N⁺(CH₃)₂(n-C₁₆H₃₃) Br⁻
(A-44)
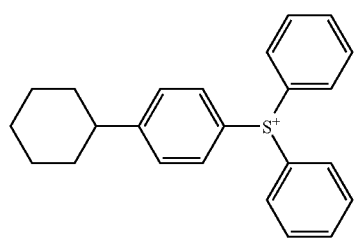
⁻O₃SCH₂CH₂NH—⟨cyclohexyl⟩
(A-45)
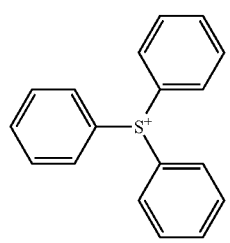
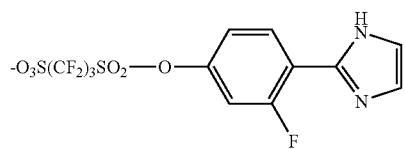
(A-46)
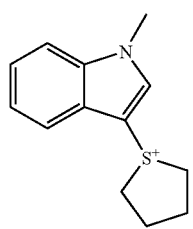 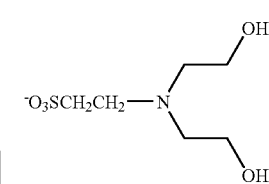
(A-47)
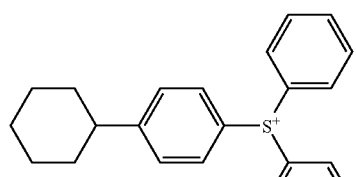
⁻O₃S(CF₂)₃SO₂—⟨C₆H₄⟩—N(piperidine)
(A-48)
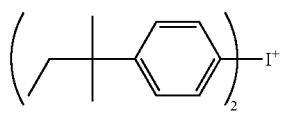
-continued
(A-49)
⁻O₃S(CF₂)₃SO₂—N(piperazine)N—CH₃
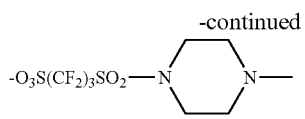
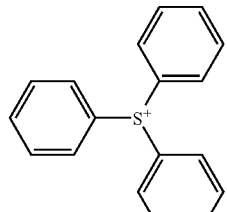
⁻O₃S(CF₂)₃SO₂—O—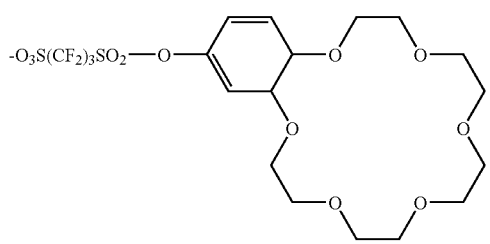
(A-50)
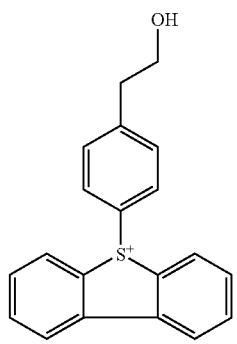
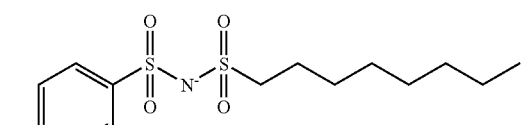
(A-51)
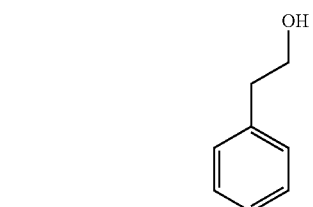
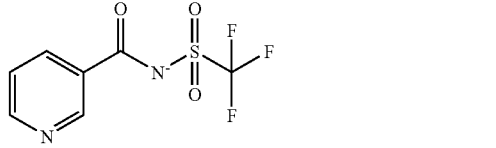

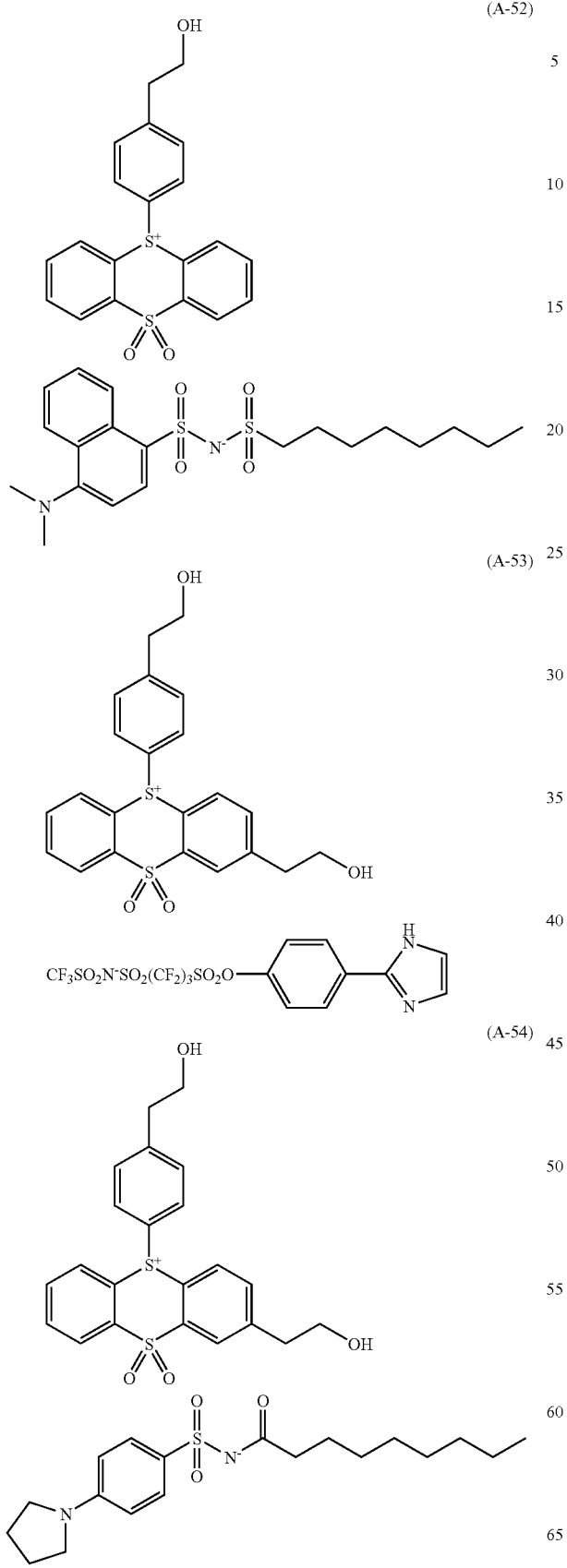
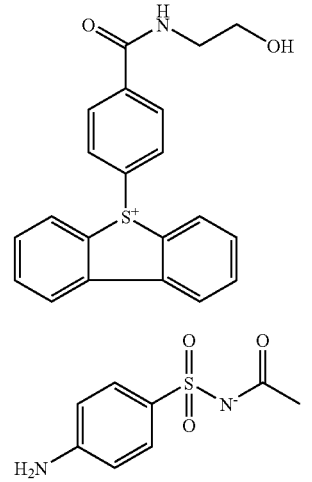

-continued
(A-58)
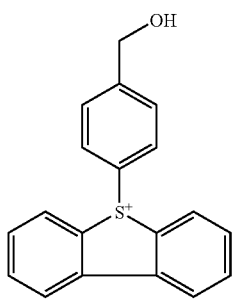
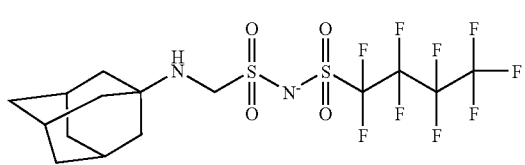
(A-59)
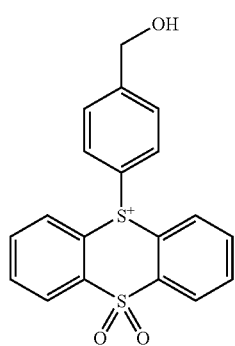
$C_4F_9SO_2N^-SO_2(CF_2)_3SO_2$—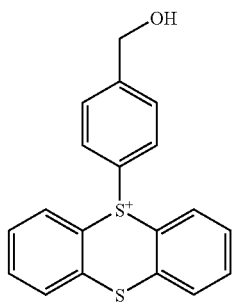
(A-60)
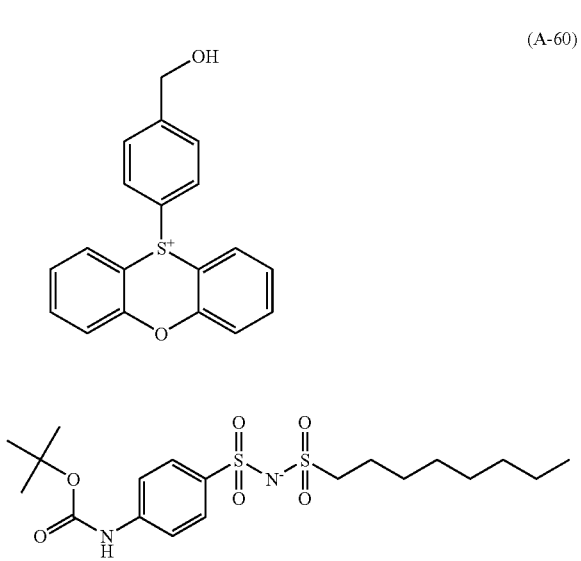
-continued
(A-61)
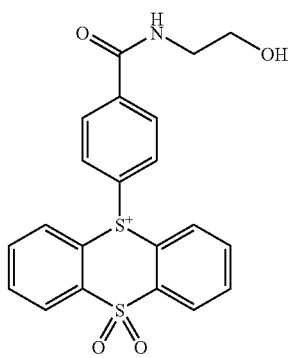
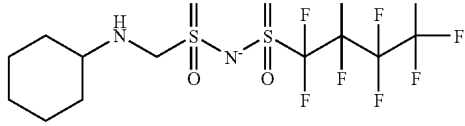
(A-62)
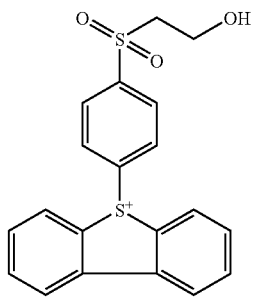
(A-63)
$CF_3SO_2NHSO_2(CF_2)_3SO_2$—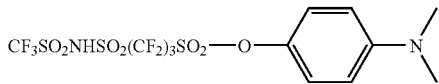

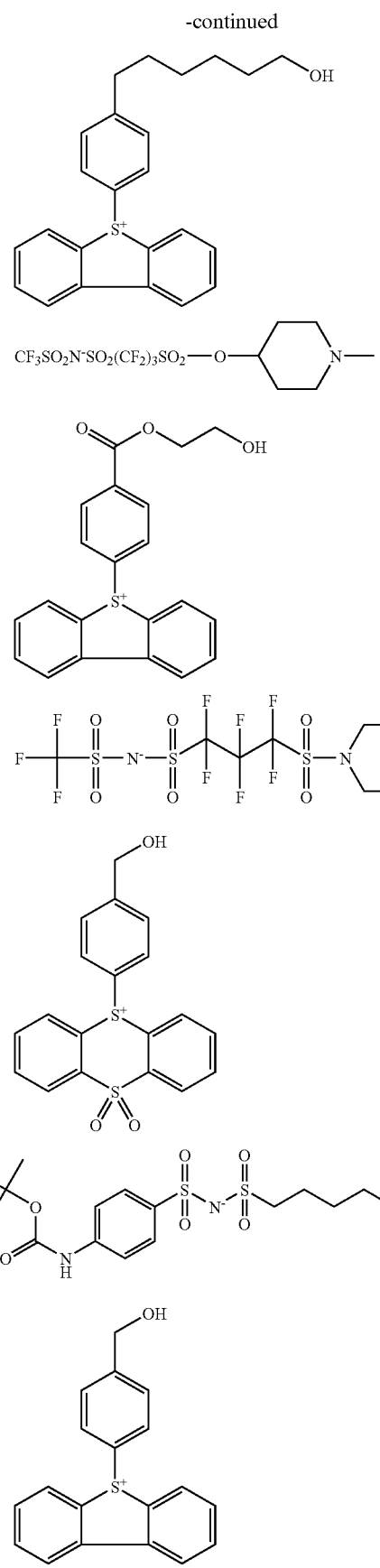
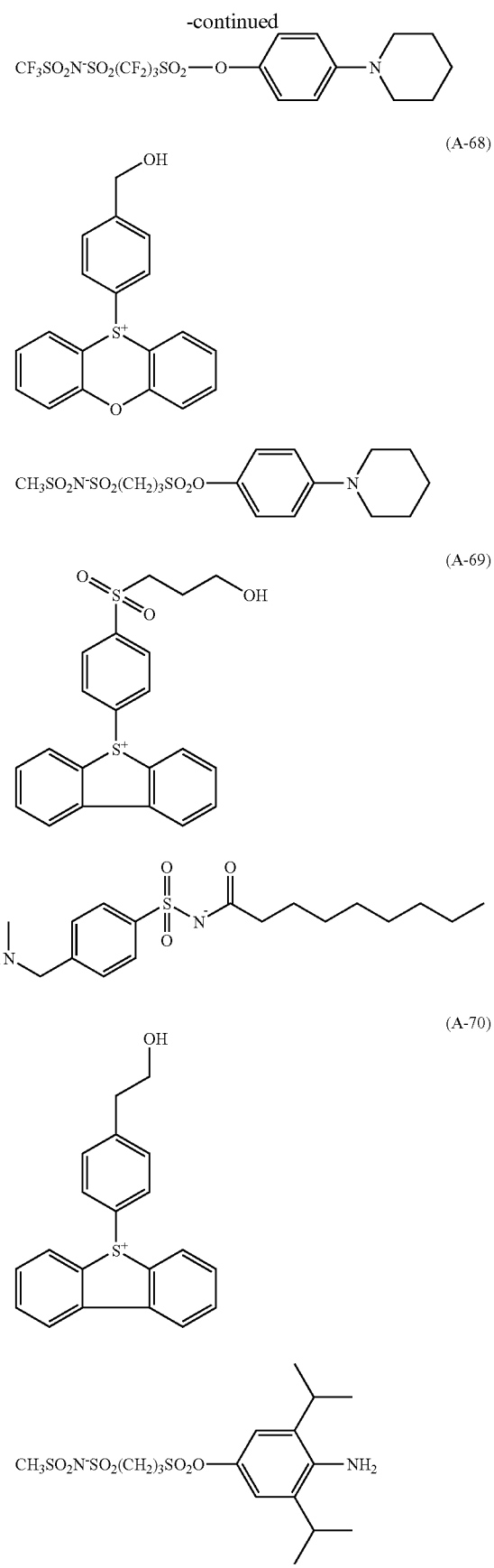

-continued
(A-71)
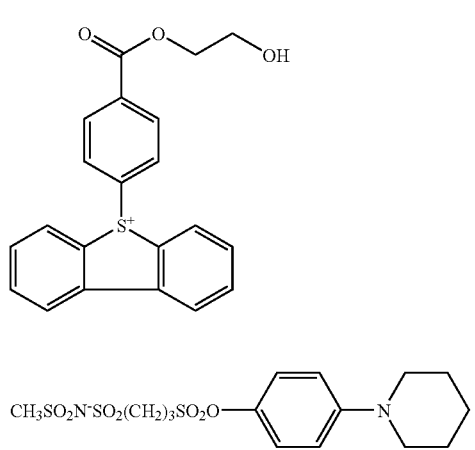
CH₃SO₂N⁻SO₂(CH₂)₃SO₂O—⟨phenyl⟩—N(piperidine)
(A-72)
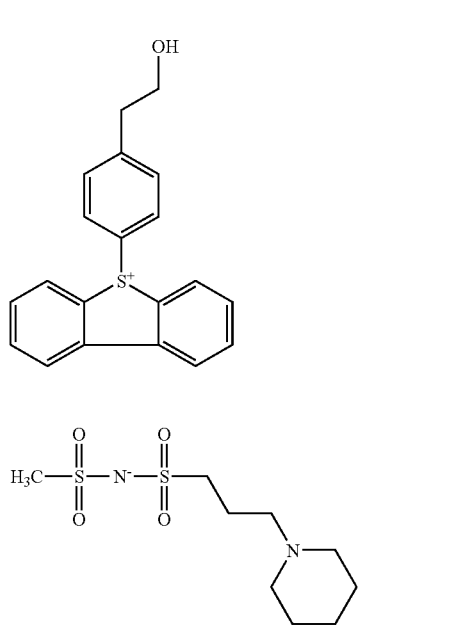
⁻O₃S(CH₂)₂N(CH₂CH₂OH)₂
(A-74)
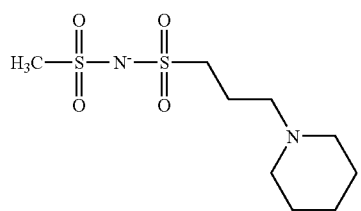
⁻O₃S(CF₂)₃SO₂—N(piperidine)-(piperidine)
(A-75)
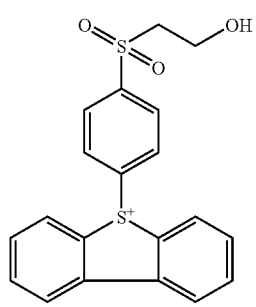
⁻O₃S(CF₂)₃SO₂—N(piperidine)-N⁺(CH₃)₂— Br⁻
(A-76)
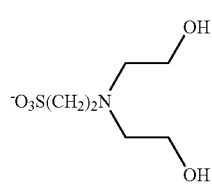
⁻O₃S(CH₂)₂NH—cyclohexyl
(A-77)

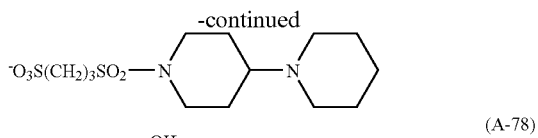

(A-78)

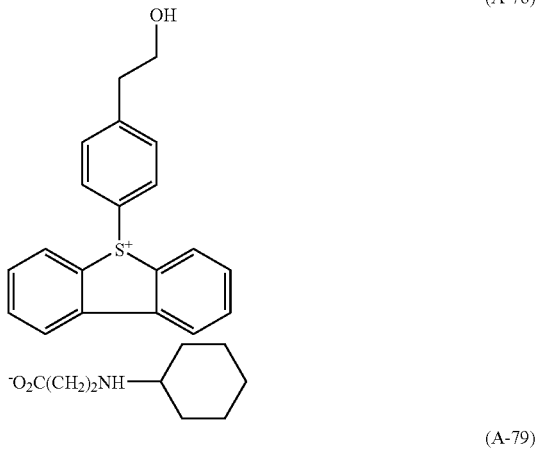

(A-79)

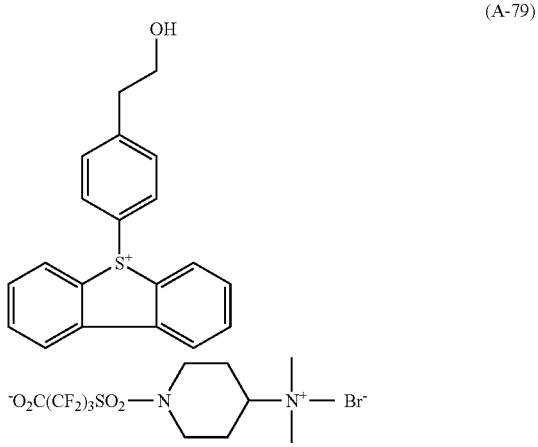

The sulfonium salt compound of the organic acid represented by formula (I) and the iodonium salt compound of the organic acid represented by formula (I) can be easily synthesized from a compound represented by formula (I) or a lithium, sodium or potassium salt thereof and a hydroxide, bromide, chloride or the like of iodonium or sulfonium, by utilizing the salt-exchange method described in JP-T-11-501909 (the term "JP-T" as used herein means a "published Japanese translation of a PCT patent application") or JP-A-2003-246786.

The content of the compound (A) in the positive resist composition of the present invention is preferably from 0.1 to 20 mass %, more preferably from 0.5 to 10 mass %, still more preferably from 1 to 7 mass %, based on the solid content of the composition.

Compound Capable of Generating an Acid Upon Irradiation with an Actinic Ray or Radiation:

The positive resist composition of the present invention contains a compound capable of generating an acid upon irradiation with an actinic ray or radiation (hereinafter sometimes referred to as an "acid generator").

The acid generator may be appropriately selected from a photo-initiator for cationic photopolymerization, a photo-initiator for radical photopolymerization, a photodecoloring agent for dyes, a photodiscoloring agent, a known compound used for microresist or the like and capable of generating an acid upon irradiation with an actinic ray or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with an actinic ray or radiation, preferred are the compounds represented by the following formulae (ZI), (ZII) and (ZIII):

(ZI)

(ZII)

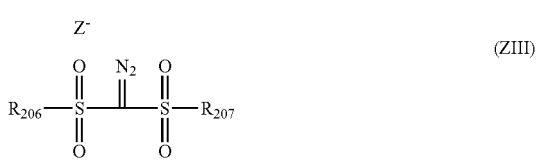

(ZIII)

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. By this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by depriving one hydrogen atom from a pyrrole), a furan residue (a group formed by depriving one hydrogen atom from a furan), a thiophene residue (a group formed by depriving one hydrogen atom from a thiophene), an indole residue (a group formed by depriving one hydrogen atom from an indole), a benzofuran residue (a group formed by depriving one hydrogen atom from a benzofuran) and a benzothiophene residue (a group formed by depriving one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

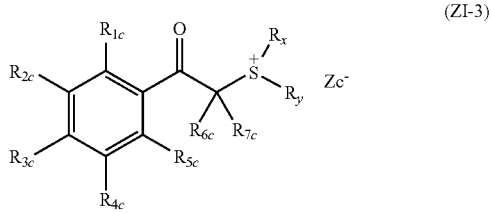

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$, may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by depriving one hydrogen atom from a pyrrole), a furan residue (a group formed by depriving one hydrogen atom from a furan), a thiophene residue (a group formed by depriving one hydrogen atom from a thiophene), an indole residue (a group formed by depriving one hydrogen atom from an indole), a benzofuran residue (a group formed by depriving one hydrogen atom from a benzofuran) and a benzothiophene residue (a group formed by depriving one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the compound capable of generating an acid upon irradiation with an actinic ray or radiation, which can be used, include the compounds represented by the following formulae (ZIV), (ZV) and (ZVI).

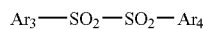
(ZIV)

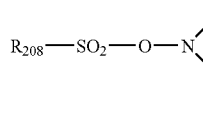
(ZV)

-continued

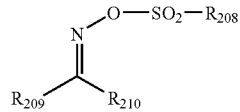
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the compounds capable of generating an acid upon irradiation with an actinic ray or radiation, more preferred are the compounds represented by formulae (ZI) to (ZIII).

Also, the compound capable of generating an acid upon irradiation with an actinic ray or radiation is preferably a compound capable of generating an acid having one sulfonic acid group or imide group, more preferably a compound capable of generating a monovalent perfluoroalkanesulfonic acid, a compound capable of generating a monovalent aromatic sulfonic acid substituted by a fluorine atom or a fluorine atom-containing group, or a compound capable of generating a monovalent imide acid substituted by a fluorine atom or a fluorine atom-containing group, still more preferably a sulfonium salt of fluoro-substituted alkanesulfonic acid, fluorine-substituted benzenesulfonic acid or fluorine-substituted imide acid. As for the acid generator which can be used, the acid generated is preferably a fluoro-substituted alkanesulfonic acid, fluoro-substituted benzenesulfonic acid or fluoro-substituted imide acid, with the pKa being pKa=−1 or less, and in this case, the sensitivity can be enhanced.

Out of the compounds capable of generating an acid upon irradiation with an actinic ray or radiation, particularly preferred compounds are set forth below.

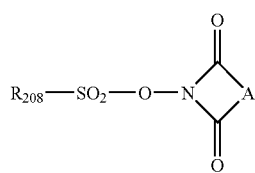
(z1)

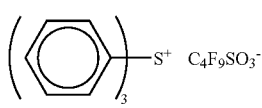
(z2)

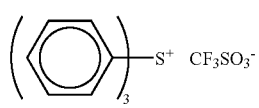
(z3)

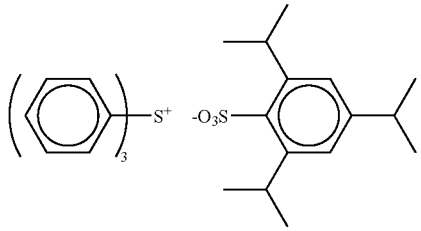
(z4)

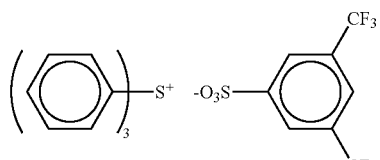
(z5)

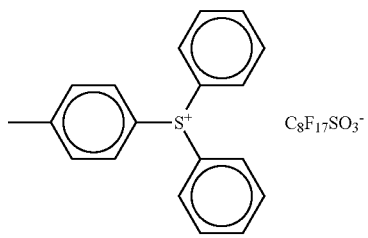
(z6)

-continued
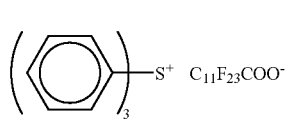 (z7)
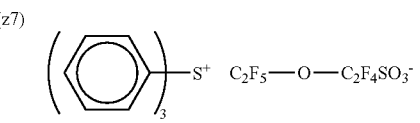 (z8)
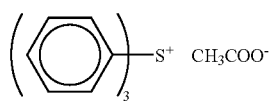 (z9)
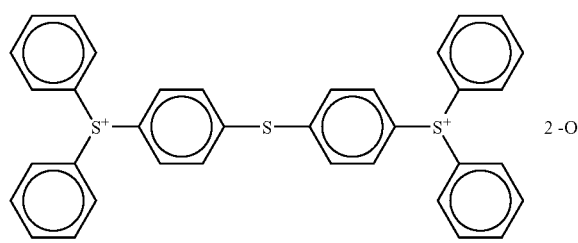 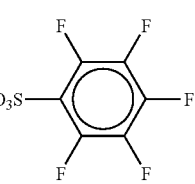 (z10)
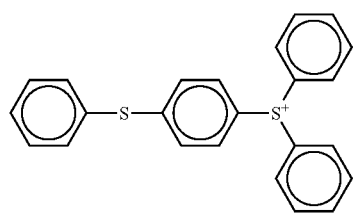 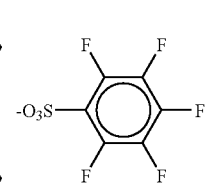 (z11)
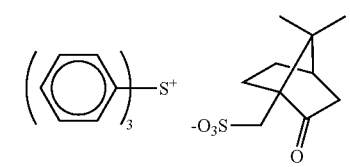 (z12)
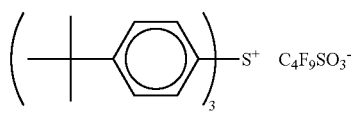 (z13)
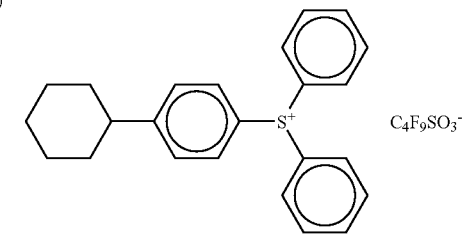 (z14)
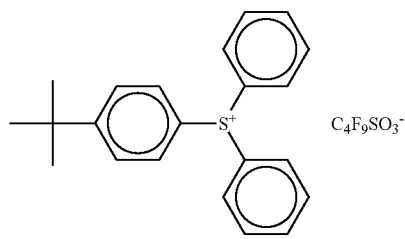 (z15)
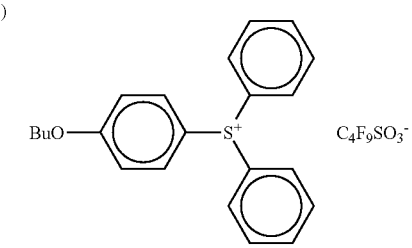 (z16)
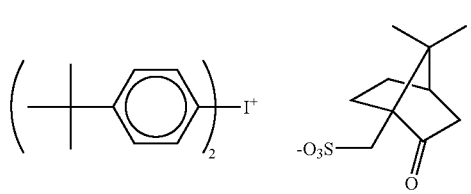 (z17)
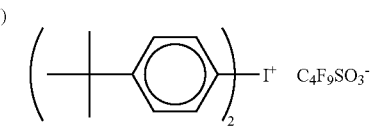 (z18)
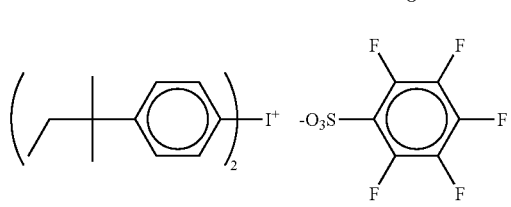 (z19)
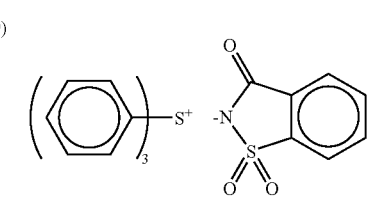 (z20)

-continued

-continued
(z37) 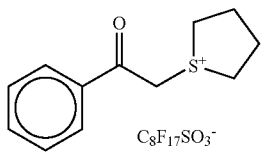
(z38) 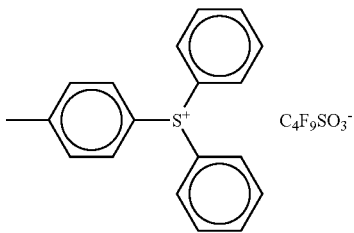
(z39) 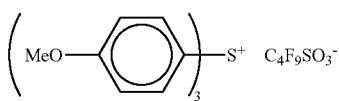
(z40) 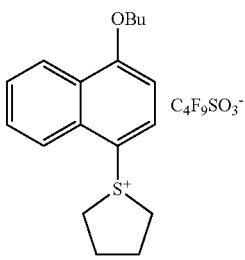
(z41) 
(z42) 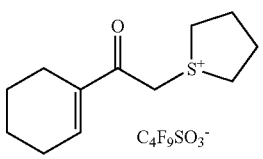
(z43) 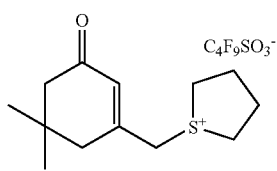
(z44) 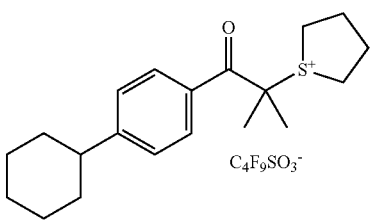
(z45) 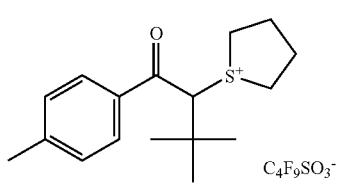
(z46) 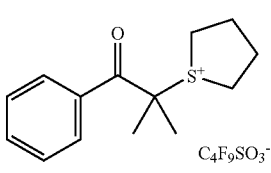
(z47) 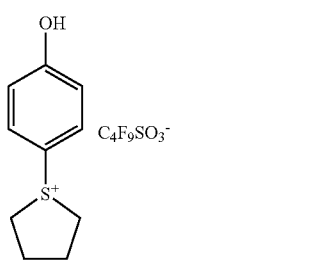
(z48) 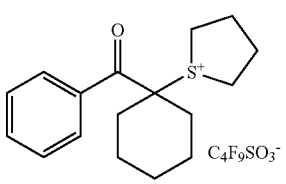
(z49) 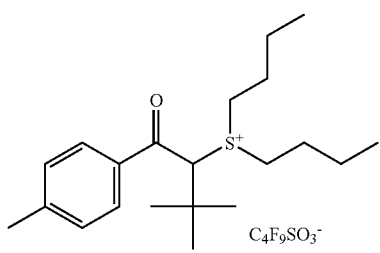
(z50) 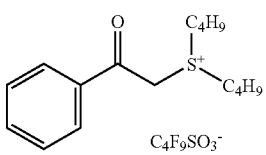

-continued
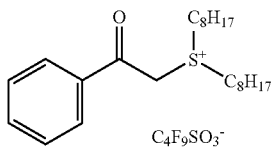 (z51)
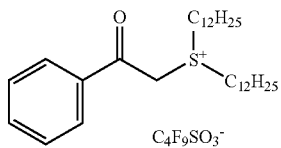 (z52)
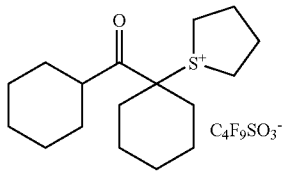 (z53)
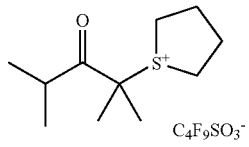 (z54)
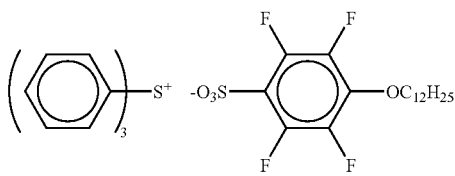 (z55)
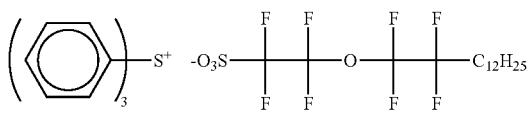 (z56)
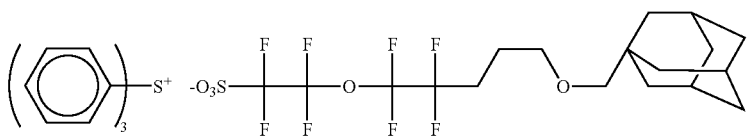 (z57)
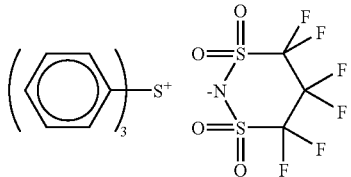 (z58)
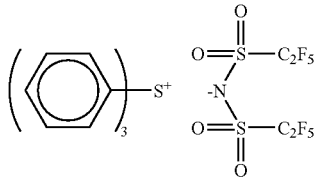 (z59)
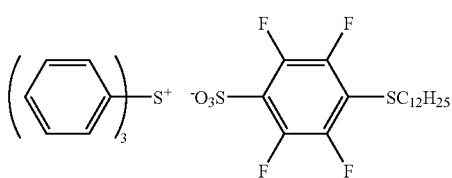 (z60)
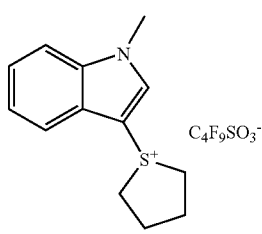 (z61)
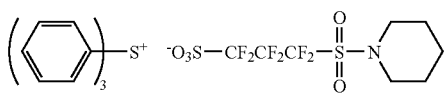 (z62)
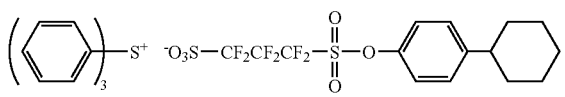 (z63)
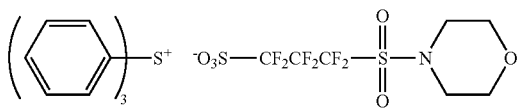 (z64)
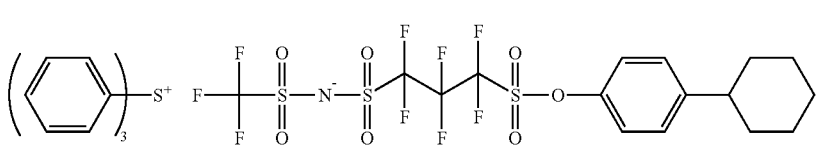 (z65)

(z66)

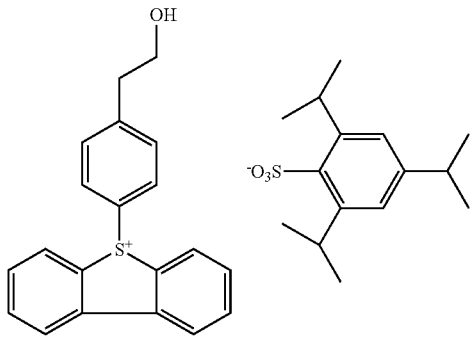

(z67)

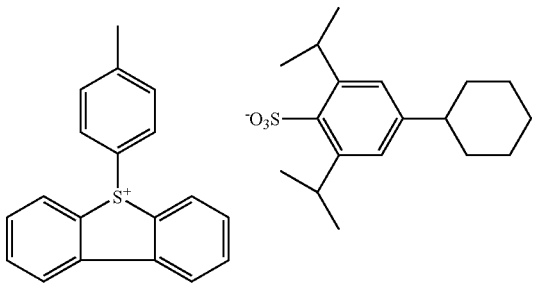

(z68)

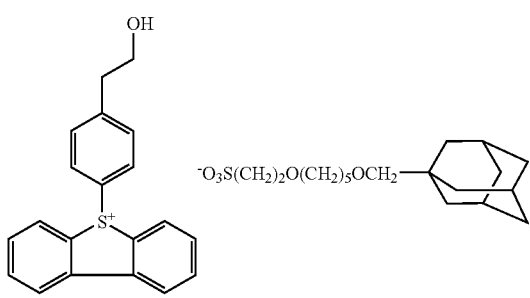

(z69)

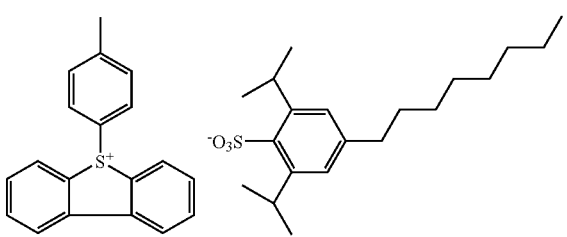

As for the acid generator, one kind may be used alone, or two or more kinds may be used in combination.

The amount of the acid generator is, in terms of the molar ratio (compound (A)/acid generator), usually from 90/10 to 1/99, preferably from 60/40 to 1/99, more preferably from 50/50 to 2/98.

Rein Capable of Decomposing by the Action of an Acid to Increase the Solubility in an Alkali Developer:

The resin capable of decomposing by the action of an acid to increase the solubility in an alkali developer (hereinafter sometimes referred to as an "acid-decomposable resin"), which is used in the positive resist composition of the present invention, is a resin having a group capable of decomposing by the action of an acid to produce an alkali-soluble group ("an acid-decomposable group"), in either one or both of the main chain and the side chain of the resin. Of these, a resin having an acid-decomposable group in the side chain is preferred.

The group preferred as the acid-decomposable group is a group obtained by substituting the hydrogen atom of an alkali-soluble group such as —COOH group and —OH group by a group capable of leaving by the action of an acid.

In the present invention, the acid-decomposable group is preferably an acetal group or a tertiary ester group.

In the case where such a group capable of decomposing by the action of an acid is bonded as a side chain, the matrix resin is an alkali-soluble resin having a —OH or —COOH group in the side chain. Examples thereof include an alkali-soluble resin described below.

The alkali dissolution rate of such an alkali-soluble resin is preferably 170 Å/sec or more, more preferably 330 Å/sec or more, as measured (at 23° C.) in 0.261N tetramethylammonium hydroxide (TMAH).

From this standpoint, the alkali-soluble resin is preferably an alkali-soluble resin having a hydroxystyrene structural unit, such as o-, m- or p-poly(hydroxystyrene) and a copolymer thereof, hydrogenated poly(hydroxystyrene), halogen- or alkyl-substituted poly(hydroxystyrene), partially O-alkylated or O-acylated poly-(hydroxystyrene), styrene-hydroxystyrene copolymer, α-methylstyrene-hydroxystyrene copolymer and hydrogenated novolak resin; or an alkali-soluble resin containing a repeating unit having a carboxyl group such as (meth)acrylic acid and norbornene carboxylic acid.

Preferred examples of the repeating unit having an acid-decomposable group for use in the present invention include a tert-butoxycarbonyloxystyrene, a 1-alkoxyethoxystyrene and a tertiary alkyl (meth)acrylate. Among these, a 2-alkyl-2-adamantyl(meth)acrylate and a dialkyl(1-adamantyl)methyl(meth)acrylate are more preferred.

The acid-decomposable resin for use in the present invention can be obtained by reacting a precursor of a group capable of decomposing by the action of an acid with an alkali-soluble resin or copolymerizing an alkali-soluble resin monomer bonded by a group capable of decomposing by the action of an acid with various monomers, and this is disclosed in European Patent 254853, JP-A-2-25850, JP-A-3-223860 and JP-A-4-251259.

In the case of irradiating the positive resist composition of the invention with KrF excimer laser light, electron beam, X-ray or high energy ray at a wavelength of 50 nm or less (e.g., EUV), the acid-decomposable resin preferably contains a repeating unit having an aromatic group, and the resin is more preferably an acid-decomposable resin having a hydroxystyrene repeating unit (hereinafter sometimes referred to as a "resin (B1)"), still more preferably a copolymer of hydroxystyrene/hydroxystyrene protected with an acid-decomposable group, or hydroxystyrene/tertiary alkyl (meth)acrylate.

Specific examples of the resin (B1) are set forth below, but the present invention is not limited thereto.

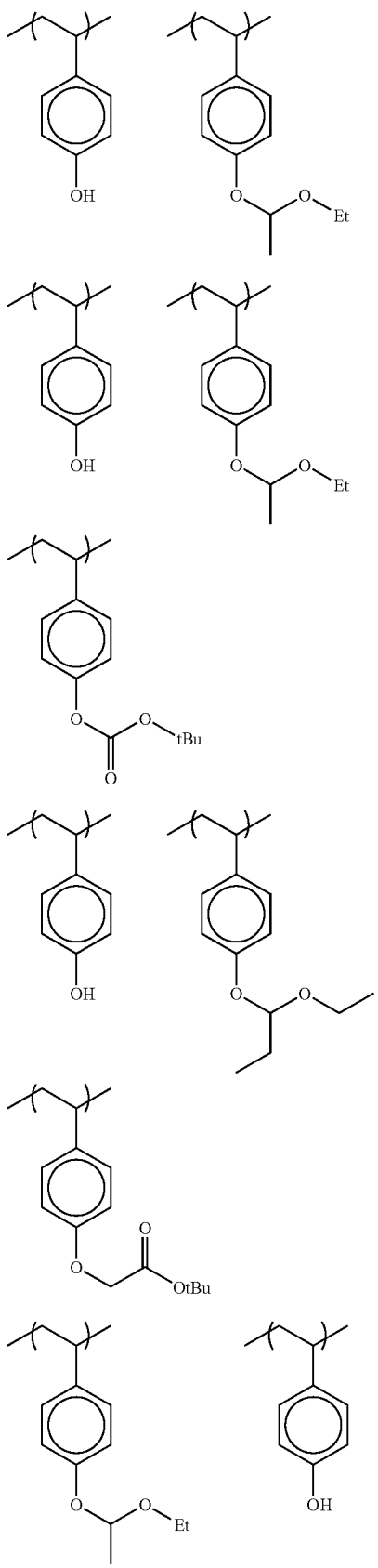

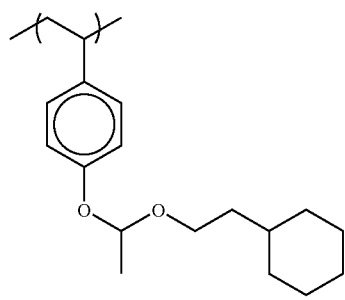
(R-9)
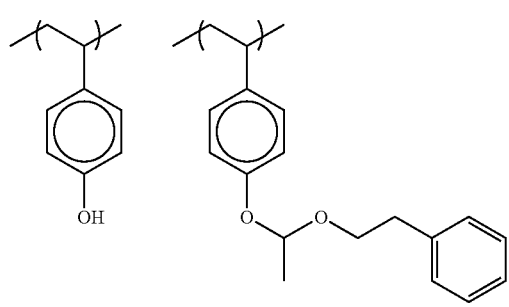
(R-10)
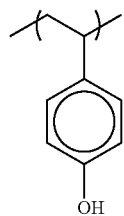
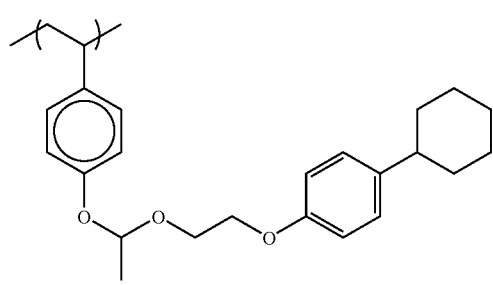
(R-11)
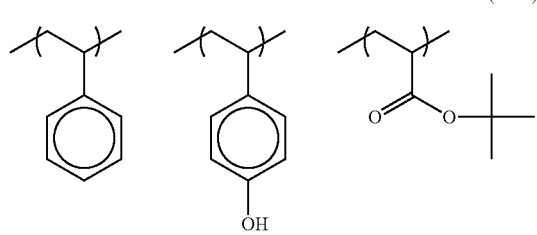
(R-12)
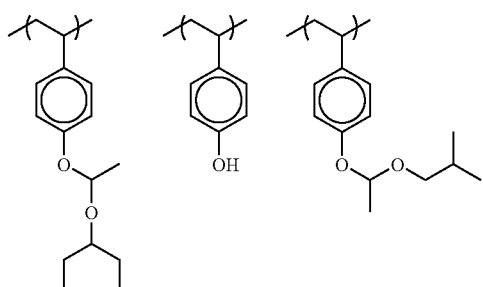
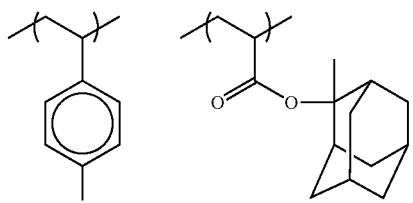
(R-13)
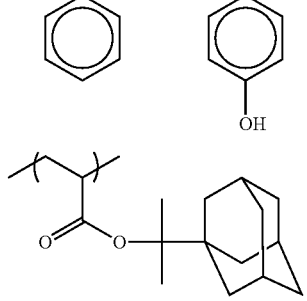
(R-14)
(R-15)

-continued

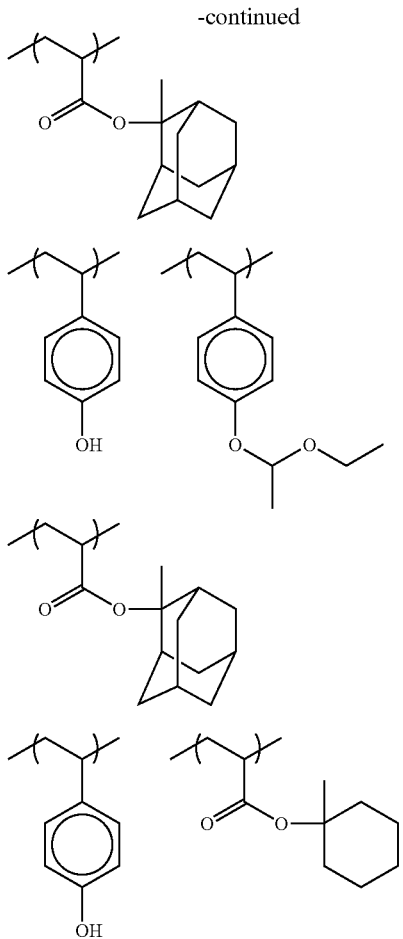

(R-16)

(R-17)

In specific examples above, tBu indicates a tert-butyl group.

The content of the group capable of decomposing by the action of an acid is expressed by B/(B+S) using the number (B) of groups capable of decomposing by the action of an acid and the number (S) of alkali-soluble groups not protected by a group capable of leaving by the action of an acid, in the resin. The content is preferably from 0.01 to 0.7, more preferably from 0.05 to 0.50, still more preferably from 0.05 to 0.40.

The resin (B1) is preferably a rein having a repeating unit represented by the following formula (II) and a repeating unit represented by formula (III).

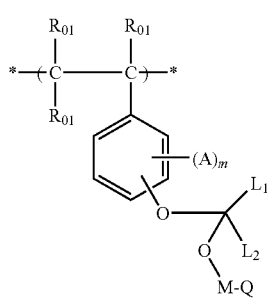

(II)

-continued

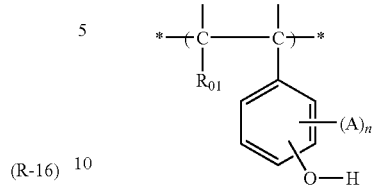

(III)

In formulae (II) and (III), each $R_{01}$ independently represents a hydrogen atom, an alkyl group, a cycloalkyl group, a halogen atom, a cyano group or an alkoxycarbonyl group.

Each of $L_1$ and $L_2$, which may be the same or different, represents a hydrogen atom, an alkyl group, a cycloalkyl group or an aralkyl group.

M represents a single bond or a divalent linking group.

Q represents an alkyl group, a cycloalkyl group or an alicyclic or aromatic ring group which may contain a heteroatom.

At least two members out of Q, M and $L_1$ may combine to form a 5- or 6-membered ring.

A represents a halogen atom, a cyano group, an acyl group, an alkyl group, an alkoxy group, an acyloxy group or an alkoxycarbonyl group.

Each of m and n independently represents an integer of 0 to 4, provided that m and n are preferably not 0 at the same time.

The resin (B1) may be a resin having a repeating unit represented by formula (II), a repeating unit represented by formula (III) and a repeating unit represented by formula (IV). In this case, m and n may be m=n=0.

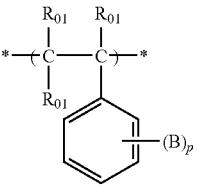

(IV)

In formula (IV), each $R_{01}$ independently represents a hydrogen atom, an alkyl group, a cycloalkyl group, a halogen atom, a cyano group or an alkoxycarbonyl group.

B represents a halogen atom, a cyano group, an acyl group, an alkyl group, an alkoxy group, an acyloxy group or an alkoxycarbonyl group.

p represents an integer of 0 to 5.

The substituent on the benzene ring in the repeating unit represented by formula (II) is a group (acid-decomposable group) capable of decomposing by the action of an acid to produce a hydroxyl group (alkali-soluble group) and decomposes by the action of an acid to produce a hydroxystyrene unit and convert the resin into a resin of which solubility in an alkali developer is increased.

In formulae (II) to (IV), Each $R_{01}$ independently represents a hydrogen atom, an alkyl group, a cycloalkyl group, a halogen atom, a cyano group or an alkoxycarbonyl group and preferably has a carbon number of 20 or less.

The alkyl group and cycloalkyl group in $R_{01}$ preferably have a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and examples of the substituent include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent preferably has a carbon number of 8 or less. A $CF_3$ group, an alkoxycarbonylmethyl group, an alkylcarbonyloxymethyl group, a hydroxymethyl group, an alkoxymethyl group and the like are more preferred.

The halogen atom in $R_{01}$ includes a fluorine atom, a chlorine atom, a bromine atom and an iodine atom and is preferably a fluorine atom.

As for the alkyl group contained in the alkoxycarbonyl group of $R_{01}$, the same as those described above for the alkyl group of $R_{01}$ are preferred.

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group as $L_1$ and $L_2$ is, for example, an aryl group having a carbon number of 6 to 15, and specific preferred example thereof include a phenyl group, a tolyl group, a naphthyl group and an anthryl group.

The aralkyl group as $L_1$ and $L_2$ is, for example, an aralkyl group having a carbon number of 6 to 20, and examples thereof include a benzyl group and a phenethyl group.

The divalent linking group as M is, for example, an alkylene group, a cycloalkylene group, an alkenylene group, an arylene group, —OCO—, —COO—, —CON($R_0$)— or a linking group containing a plurality of these members. $R_0$ is a hydrogen atom or an alkyl group.

The alkyl group and cycloalkyl group of Q are the same as the alkyl group and cycloalkyl group, respectively, of $L_1$ and $L_2$.

The alicyclic or aromatic ring group of Q, which may contain a heteroatom, includes, for example, the cycloalkyl group and aryl group of $L_1$ and $L_2$ and preferably has a carbon number of 3 to 15.

Examples of the heteroatom-containing alicyclic or aromatic ring group include thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the heteroatom-containing alicyclic or aromatic ring group is not limited thereto as long as the ring is a structure generally called a hetero ring (a ring formed by carbon and heteroatom or a ring formed by heteroatom).

As for the 5- or 6-membered ring which may be formed by combining at least two members out of Q, M and $L_1$, there is included a case where at least two members out of Q, M and $L_1$ combine to form, for example, a propylene group or a butylene group, thereby forming a 5- or 6-membered ring containing an oxygen atom.

The group represented by -M-Q preferably has a carbon number of 1 to 30, more preferably from 5 to 20, and, for example, the group represented by —OC($L_1$)($L_2$)O-M-Q includes the followings.

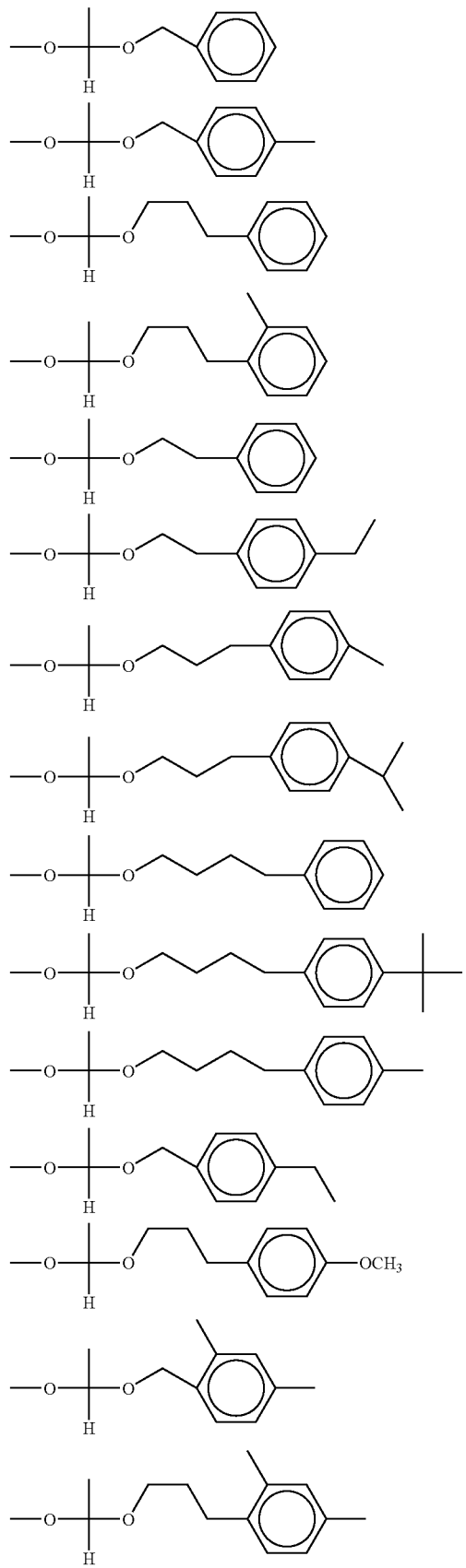

-continued

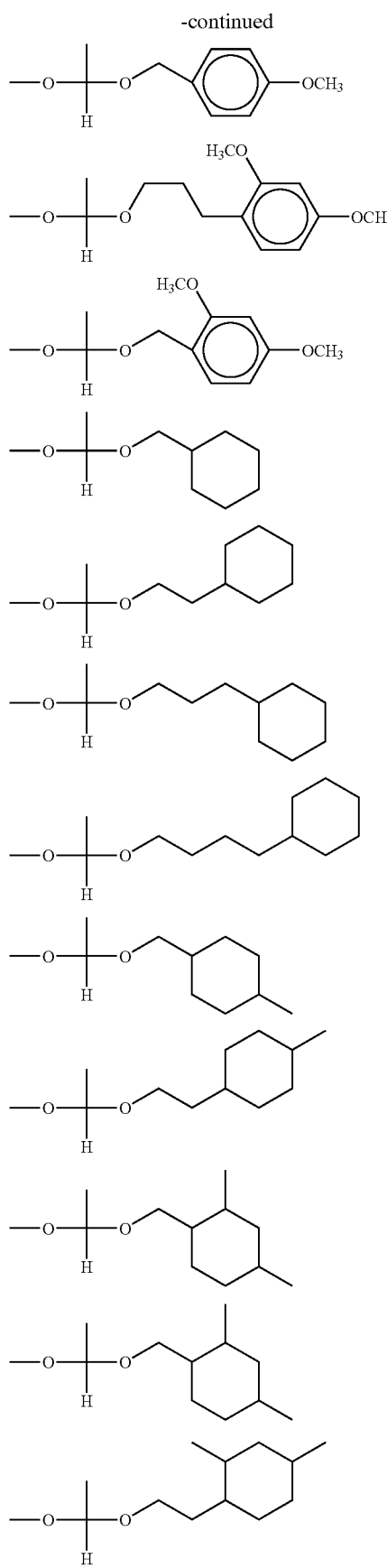

-continued

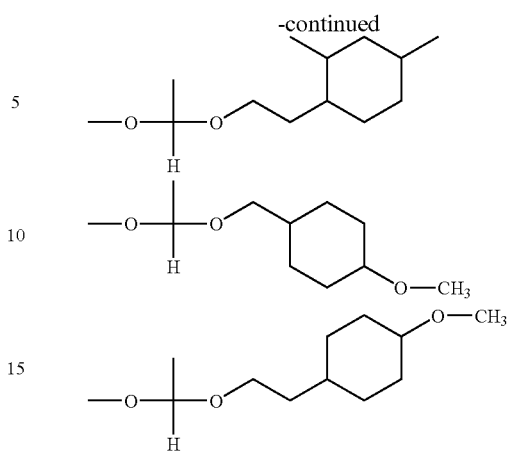

The acyl group as A is, for example, an acyl group having a carbon number of 2 to 8, and specific preferred examples thereof include a formyl group, an acetyl group, a propanoyl group, a butanoyl group, a pivaloyl group and a benzoyl group.

The alkyl group as A is, for example, an alkyl group having a carbon number of 1 to 8, and specific preferred examples thereof include a methyl group, an ethyl group, a propyl group, an n-butyl group, a sec-butyl group, a hexyl group and an octyl group.

The alkoxy group as A is, for example, the above-described alkoxy group having a carbon number of 1 to 8, and examples thereof include a methoxy group, an ethoxy group, a propoxy group, a butoxy group, a pentyloxy group, a hexyloxy group and a cyclohexyloxy group.

The acyloxy group or alkoxycarbonyl group as A includes groups corresponding to the above-described acyl group or alkoxy group.

These groups each may have a substituent, and preferred examples of the substituent include a hydroxyl group, a carboxyl group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

Each of m and n independently represents an integer of 0 to 4. Each of m and n is preferably an integer of 0 to 2, more preferably 1.

Specific examples of the repeating unit represented by formula (II) are set forth below, but the present invention is not limited thereto.

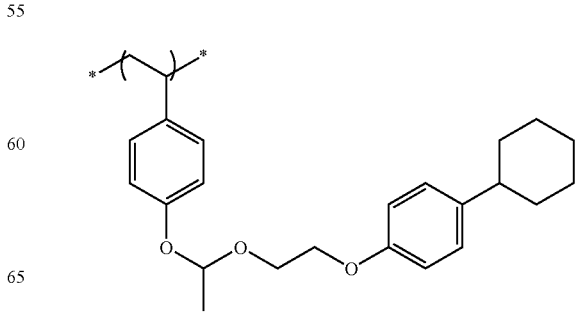

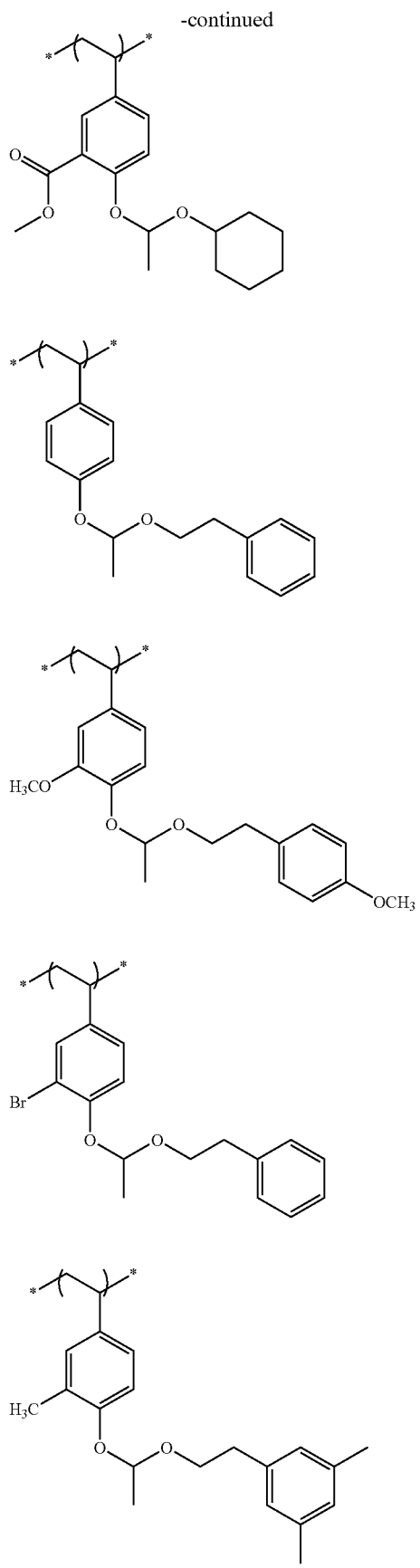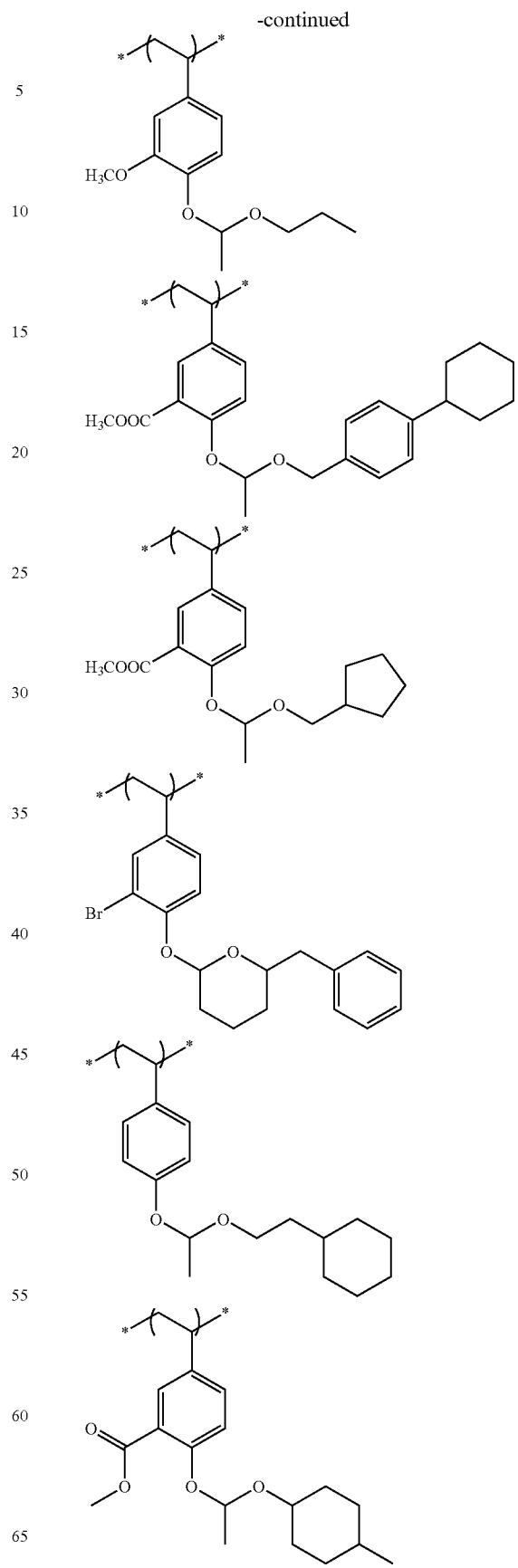

-continued
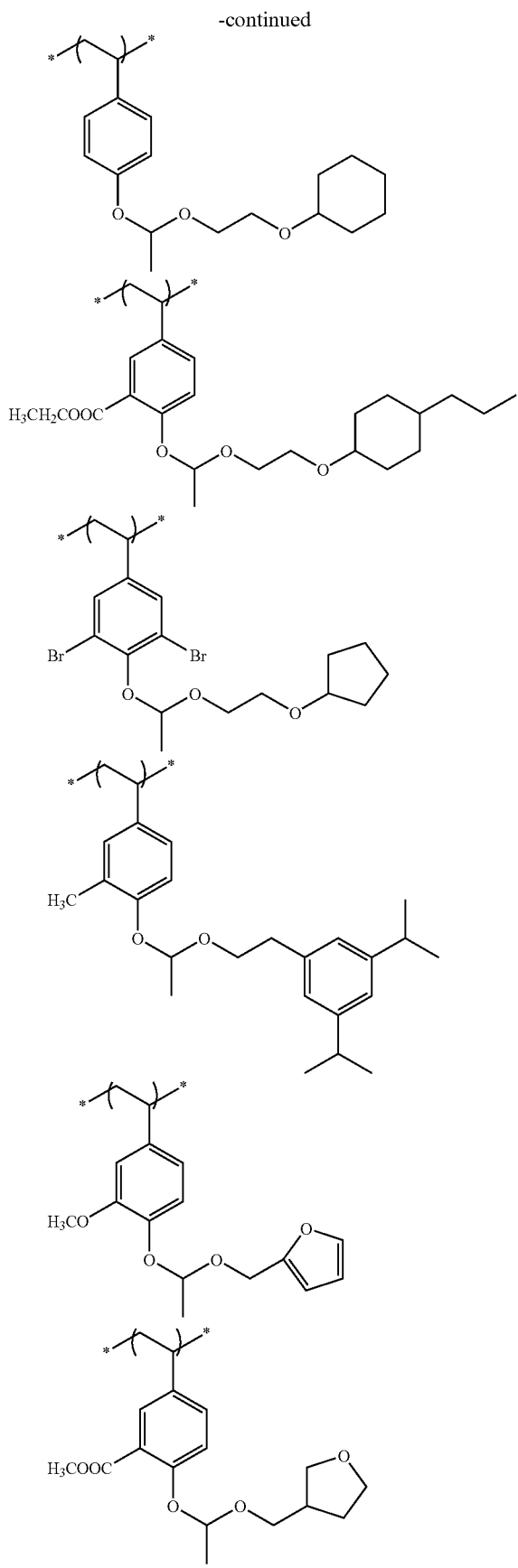
-continued
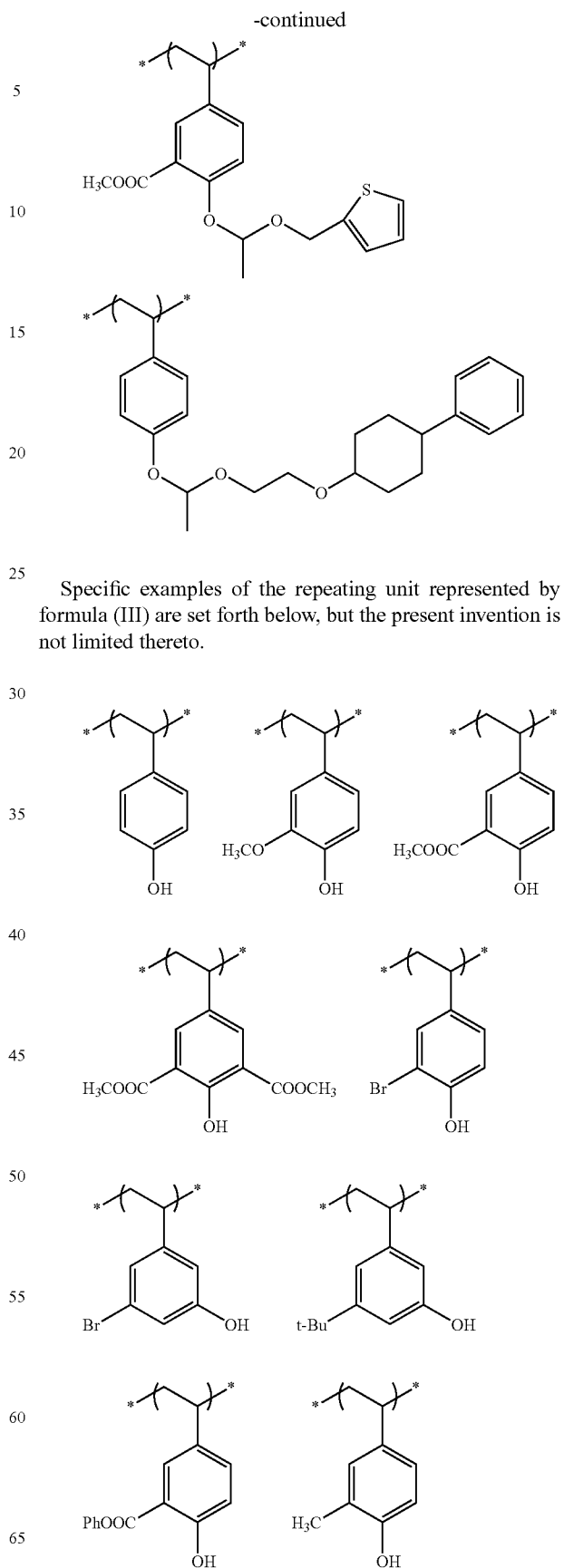
Specific examples of the repeating unit represented by formula (III) are set forth below, but the present invention is not limited thereto.

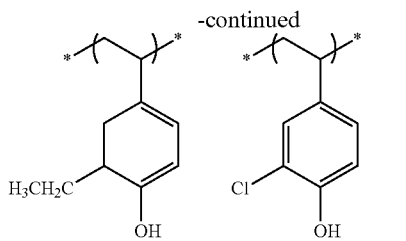
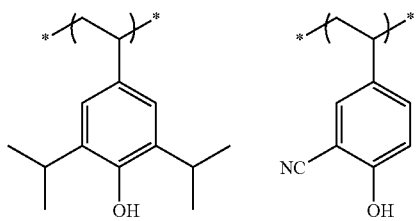
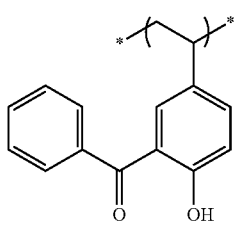

Each $R_{01}$ in formula (IV) independently represents a hydrogen atom, an alkyl group, a cycloalkyl group, a halogen atom, a cyano group or an alkoxycarbonyl group and preferably has a carbon number of 20 or less, and examples thereof are the same as those of $R_{01}$ in formula (II) or (III).

The acyl group, alkyl group, alkoxy group, acyloxy group and alkoxycarbonyl group as B in formula (IV) are the same as respective groups as A in formula (II).

p represents an integer of 1 to 5 and is preferably an integer of 0 to 2, more preferably 1.

Specific examples of the repeating unit represented by formula (IV) are set forth below, but the present invention is not limited thereto.

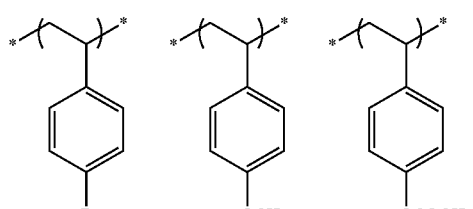
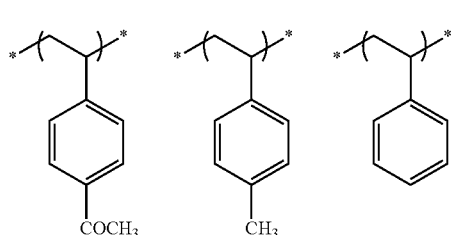
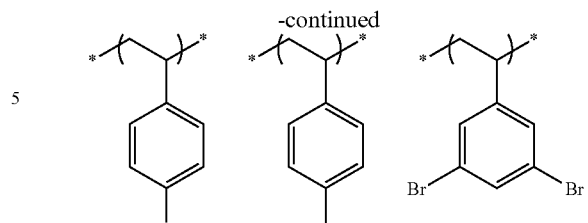
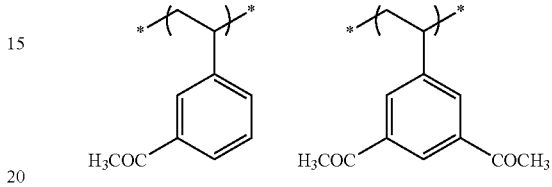

The resin (B1) may contain the following repeating unit represented by formula (V):

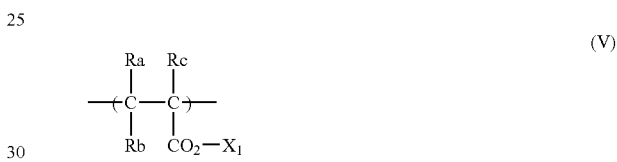

(V)

In formula (V), each of Ra to Rc independently represents a hydrogen atom, a fluorine atom, a chlorine atom, a cyano group or an alkyl group.

$X_1$ represents a hydrogen atom or an organic group.

The alkyl group as Ra to Rc in formula (V) is preferably an alkyl group having a carbon number of 1 to 5, and examples thereof include a methyl group, an ethyl group and a propyl group.

The organic group as $X_1$ preferably has a carbon number of 1 to 40 and may be an acid-decomposable group or a non-acid-decomposable group.

Examples of the non-acid-decomposable group include an alkyl group, a cycloalkyl group, an alkenyl group and an aryl group.

In the non-acid-decomposable group, the alkyl group is preferably an alkyl group having a carbon number of 1 to 4, such as methyl group, ethyl group, propyl group, n-butyl group, sec-butyl group and tert-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; and the aryl group is preferably an aryl group having a carbon number of 6 to 14, such as phenyl group, xylyl group, toluyl group, cumenyl group, naphthyl group and anthracenyl group.

Examples of the organic group of $X_1$, which is an acid-decomposable group, include —$C(R_{11a})(R_{12a})(R_{13a})$, —$C(R_{14a})(R_{15a})(OR_{16a})$ and —CO—OC$(R_{11a})(R_{12a})(R_{13a})$.

Each of $R_{11a}$ to $R_{13a}$ independently represents an alkyl group, a cycloalkyl group, an alkenyl group, an aralkyl group or an aryl group. Each of $R_{14a}$ and $R_{15a}$ independently represents a hydrogen atom or an alkyl group. $R_{16a}$ represents an alkyl group, a cycloalkyl group, an alkenyl group, an aralkyl group or an aryl group. Two members out of $R_{11a}$, $R_{12a}$ and $R_{13a}$, or two members out of $R_{14a}$, $R_{15a}$ and $R_{16a}$ may combine to form a ring.

Also, a group having an acid-decomposable group may be introduced into $X_1$ by modification. $X_1$ having introduced thereinto an acid-decomposable group is, for example, represented by the following formula:

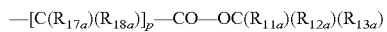

wherein each of $R_{17a}$ and $R_{18a}$ independently represents a hydrogen atom or an alkyl group, and p represents an integer of 1 to 4.

The organic group as $X_1$ is preferably an acid-decomposable group having at least one cyclic structure selected from an alicyclic structure, an aromatic cyclic structure and a crosslinked alicyclic structure, and the structure is preferably a structure containing an aromatic group (particularly phenyl group) or a structure containing an alicyclic or crosslinked alicyclic structure represented by the following formulae (pI) to (pVI):

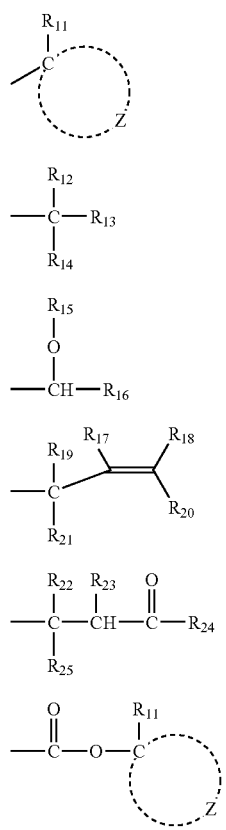

In formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

Each of $R_{12}$ to $R_{16}$ independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

Each of $R_{17}$ to $R_{21}$ independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having a carbon number of 1 to 4 or an alicyclic hydrocarbon group.

Each of $R_{22}$ to $R_{25}$ independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group of $R_{12}$ to $R_{25}$ is a linear or branched alkyl group having a carbon number of 1 to 4, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These alicyclic hydrocarbon groups each may have a substituent.

Examples of the structure of the alicyclic moiety in the alicyclic hydrocarbon group are set forth below.

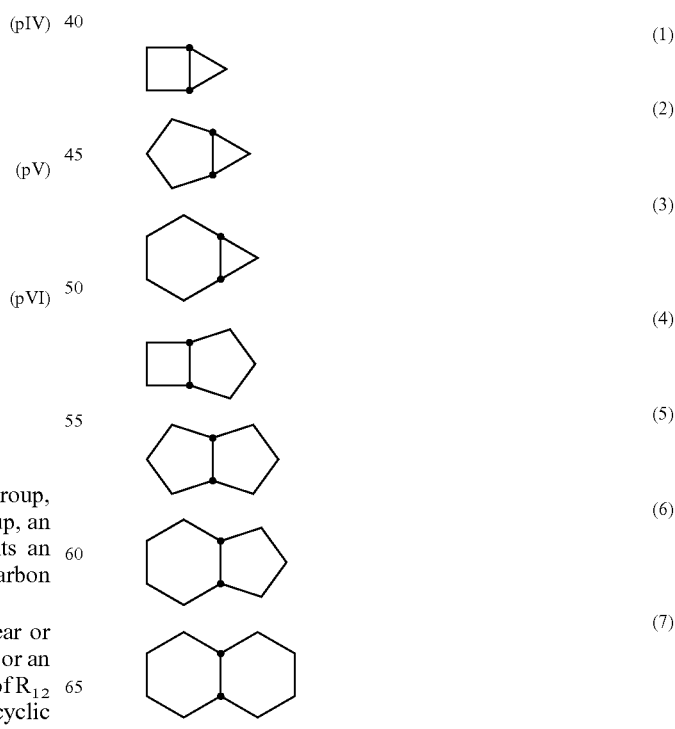

-continued
(8)
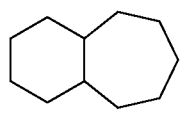
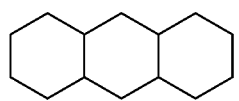
(9)
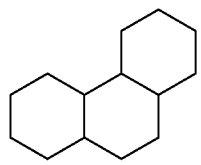
(10)
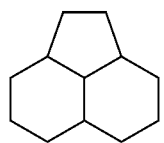
(11)
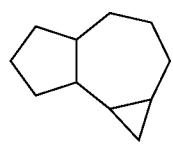
(12)
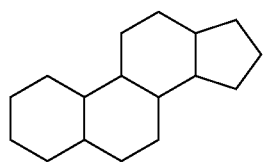
(13)
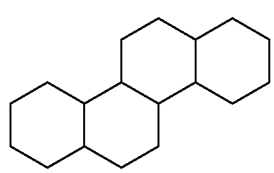
(14)
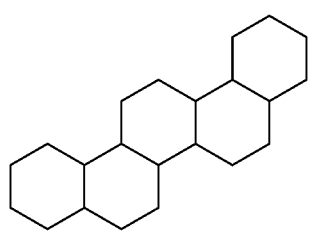
(15)
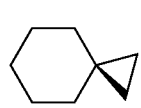
(16)
(17)
(18)
-continued
(19)
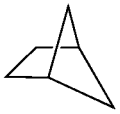
(20)
(21)
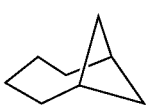
(22)
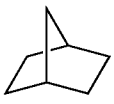
(23)
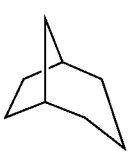
(24)
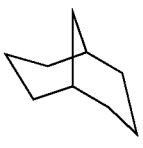
(25)
(26)
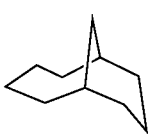
(27)
(28)
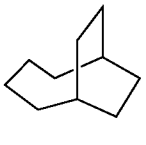
(29)
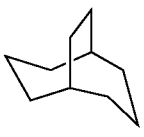
(30)

-continued

(31) 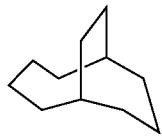

(32) 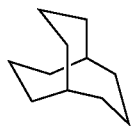

(33) 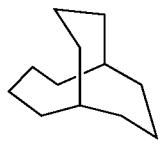

(34) 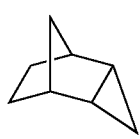

(35) 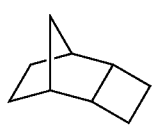

(36) 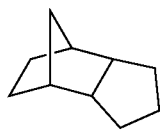

(37) 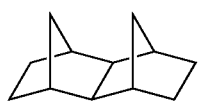

(38) 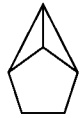

(39) 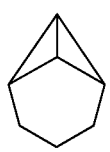

(40) 

(41) 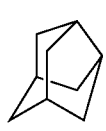

(42) 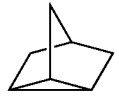

-continued

(43) 

(44) 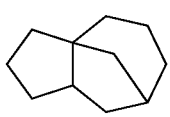

(45) 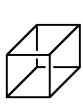

(46) 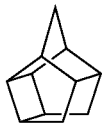

(47) 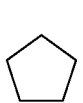

(48) 

(49) 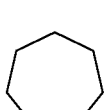

(50) 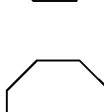

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. Examples of the alkoxy group include an alkoxy group having a carbon number of 1 to 4, such as methoxy group, ethoxy group, propoxy group and butoxy group.

The alkyl group, alkoxy group and alkoxycarbonyl group each may further have a substituent, and examples of the substituent include an alkoxy group having a carbon number of 1 to 4 (e.g., methoxy, ethoxy, butoxy), a hydroxy group, an oxo group, an alkylcarbonyl group (preferably having a carbon number of 2 to 5), an alkylcarbonyloxy group (preferably having a carbon number of 2 to 5), an alkyloxycarbonyl group (preferably having a carbon number of 2 to 5) and a halogen atom (e.g., chlorine, bromine, fluorine).

In the resin (B1), for maintaining good developability with an alkali developer, another appropriate polymerizable monomer may be copolymerized so that an alkali-soluble group such as phenolic hydroxyl group, carboxyl group, sulfonic acid group and hexafluoroisopropanol group (—C(CF$_3$)$_2$OH) can be introduced, or for enhancing the film property, another hydrophobic polymerizable monomer such as alkyl acrylate and alkyl methacrylate may be copolymerized.

The content of the repeating unit represented by formula (II) is preferably from 5 to 60 mol %, more preferably from 10 to 50 mol %, still more preferably from 10 to 40 mol %, based on all repeating units constituting the resin.

The content of the repeating unit represented by formula (III) is preferably from 40 to 90 mol %, more preferably from 45 to 80 mol %, still more preferably from 50 to 75 mol %, based on all repeating units constituting the resin.

The content of the repeating unit represented by formula (IV) is preferably from 5 to 50 mol %, more preferably from 10 to 40 mol %, still more preferably from 15 to 30 mol %, based on all repeating units constituting the resin.

The content of the repeating unit represented by formula (V) is preferably from 0 to 30 mol %, more preferably from 0 to 20 mol %, still more preferably from 0 to 10 mol %, based on all repeating units constituting the resin.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the resin.

The content of the repeating unit having an acid-decomposable group is preferably from 3 to 95 mol %, more preferably from 5 to 90 mol %, still more preferably from 10 to 85 mol %, based on all repeating units constituting the resin (B1).

The resin (B1) may be synthesized by a known synthesis method, for example, as described in European Patent 254853, JP-A-2-258500, JP-A-3-223860 and JP-A-4-251259, a method of reacting a precursor of a group capable of decomposing by the action of an acid with an alkali-soluble resin or a method of copolymerizing a monomer having a group capable of decomposing by the action of an acid with various monomers.

The weight average molecular weight of the resin (B1) is, as a polystyrene-reduced value by the GPC method, preferably 5,000 or less, more preferably from 1,000 to 5,000, still more preferably from 1,500 to 4,000, yet still more preferably from 2,000 to 3,000.

The polydispersity (Mw/Mn) of the resin (B1) is preferably from 1.0 to 3.0, more preferably from 1.05 to 2.0, still more preferably from 1.1 to 1.7.

As for the resin (B1), two or more kinds of resins may be used in combination.

Specific examples of the resin (B1) are set forth below, but the present invention is not limited thereto.

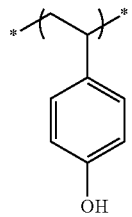

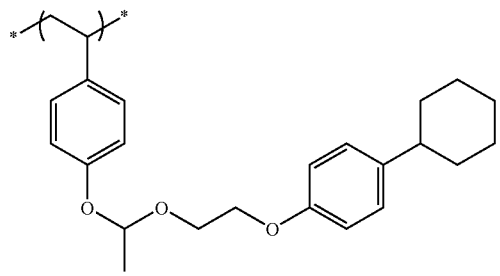

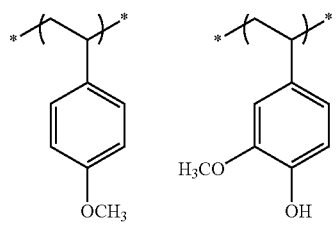

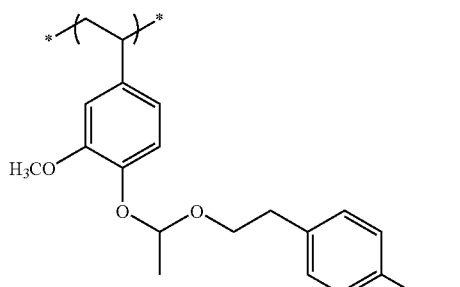

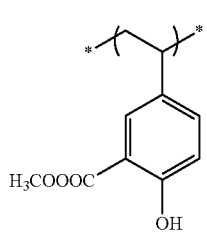

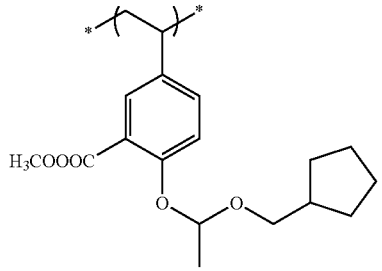 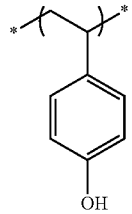

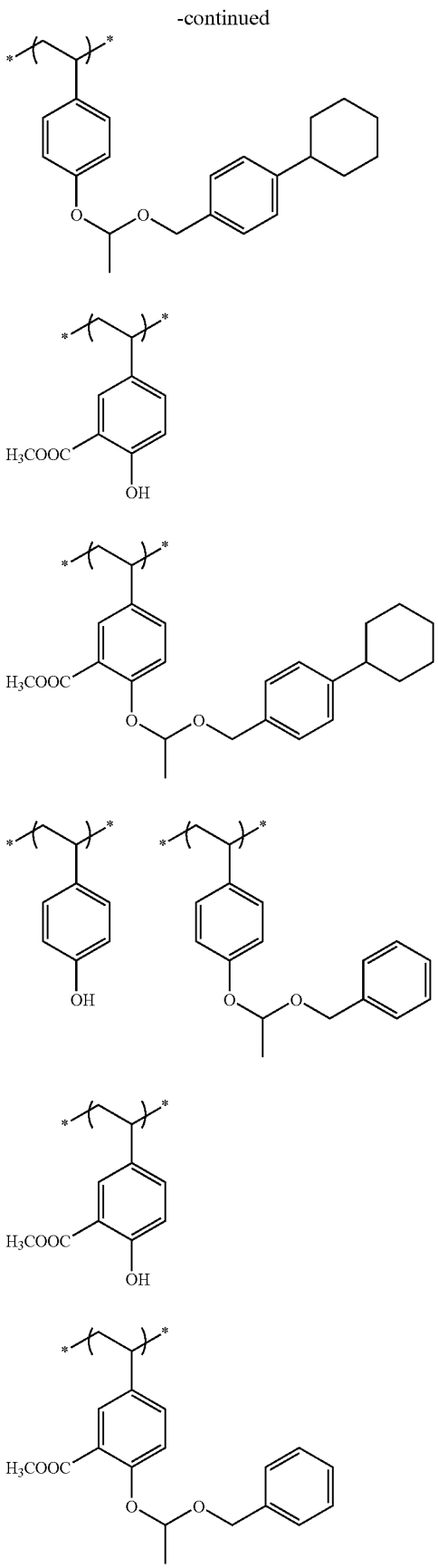

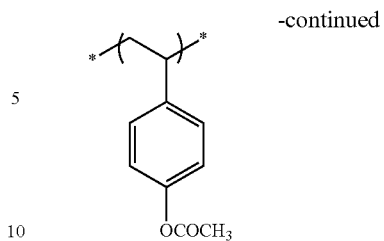

In the positive resist composition of the present invention, the amount of the acid-decomposable resin according to the present invention blended in the entire composition is preferably from 40 to 99.9 mass %, more preferably from 50 to 99 mass %, still more preferably from 80 to 96 mass %, based on the entire solid content.

Resin Soluble in an Alkali Developer:

The positive resist composition of the present invention may contain a resin soluble in an alkali developer (hereinafter sometimes referred to as an "alkali-soluble resin").

The alkali dissolution rate of the alkali-soluble resin is preferably 20 Å/sec or more, more preferably 200 Å/sec or more, as measured (at 23° C.) in 0.261 N tetramethylammonium hydroxide (TMAH).

Examples of the alkali-soluble resin for use in the present invention include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, 5 to 30 mol % being O-methylated, O-(1-methoxy)ethylated, O-(1-ethoxy)ethylated, O-2-tetrahydropyranylated or O-(tert-butoxycarbonyl)methylated) or O-acylated (for example, 5 to 30 mol % being o-acylated or O-(tert-butoxy)carbonylated), a styrene-maleic anhydride copolymer, a styrene-hydroxystyrene copolymer, an α-methylstyrene-hydroxystyrene copolymer, a carboxyl group-containing methacrylic resin and a derivative thereof, and a polyvinyl alcohol derivative.

Among these alkali-soluble resins, preferred are a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer, and an α-methylstyrene-hydroxystyrene copolymer.

The novolak resin can be obtained by subjecting a predetermined monomer as the main component to addition condensation with aldehydes in the presence of an acidic catalyst.

The weight average molecular weight of the alkali-soluble resin is generally 2,000 or more, preferably from 5,000 to 200,000, more preferably from 5,000 to 100,000.

Here, the weight average molecular weight is defined as a polystyrene-reduced value measured by gel permeation chromatography.

In the present invention, two or more kinds of these alkali-soluble resins may be used in combination.

The amount of the alkali-soluble resin used is from 40 to 97 mass %, preferably from 60 to 90 mass %, based on the solid content in the entire composition of the positive resist composition.

Dissolution-Inhibiting Compound Capable of Decomposing by the Action of an Acid to Increase the Solubility in an Alkali Developer and Having a Molecular Weight of 3,000 or Less:

The positive resist composition of the present invention may contain a dissolution-inhibiting compound capable of decomposing by the action of an acid to increase the solubility in an alkali developer and having a molecular weight of 3,000 or less.

In order to prevent reduction in the transparency to light at 220 nm or less, the dissolution-inhibiting compound capable of decomposing by the action of an acid to increase the solubility in an alkali developer and having a molecular weight of 3,000 or less (hereinafter sometimes referred to as a "dissolution-inhibiting compound") is preferably an alicyclic or aliphatic compound containing an acid-decomposable group, such as acid-decomposable group-containing cholic acid derivatives described in *Proceeding of SPIE*, 2724, 355 (1996). Examples of the acid-decomposable group and alicyclic structure are the same as those described above for the alicyclic hydrocarbon-based acid-decomposable resin.

In the case where the positive resist composition of the present invention is exposed by a KrF excimer laser or irradiated with an electron beam, the composition preferably contains a structure where the phenolic hydroxyl group of a phenol compound is replaced by an acid-decomposable group. The phenol compound is preferably a compound containing from 1 to 9 phenol skeletons, more preferably from 2 to 6 phenol skeletons.

The molecular weight of the dissolution-inhibiting compound for use in the present invention is generally 3,000 or less, preferably from 300 to 3,000, more preferably from 500 to 2,500.

The amount of the dissolution-inhibiting compound added is preferably from 3 to 50 mass %, more preferably from 5 to 40 mass %, based on the solid content of the positive resist composition.

Specific examples of the dissolution-inhibiting compound are set forth below, but the present invention is not limited thereto.

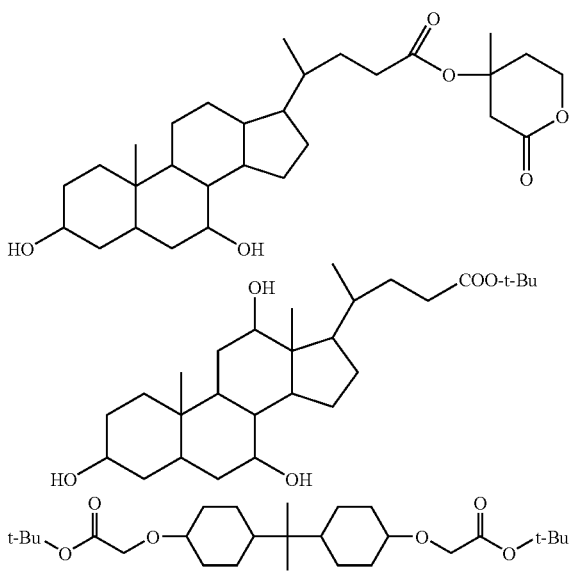

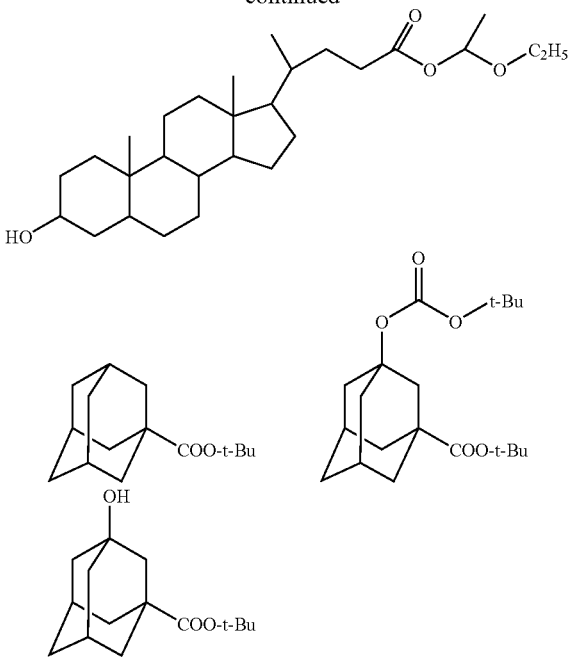

Basic Compound:

The positive resist composition of the present invention preferably contains a basic compound for reducing the change in performance with aging from exposure until heating.

As for the preferred structure, the basic compound includes a compound having a structure represented by the following formulae (A) to (E).

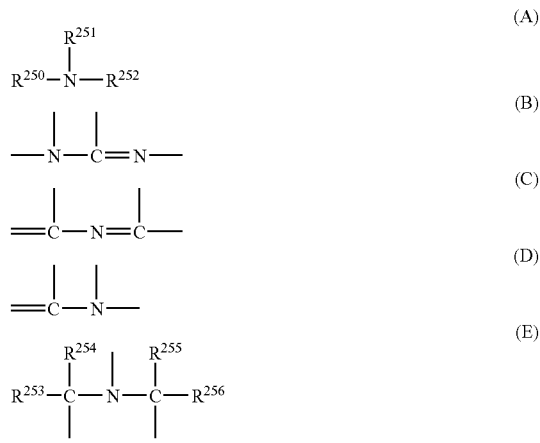

In the formulae above, each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{250}$ and $R^{251}$ may combine with each other to form a ring.

These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

The alkyl chain thereof may contain an oxygen atom, a sulfur atom or a nitrogen atom.

In the formulae, each of $R^{253}$, $R^{254}$, $R^{255}$ and $R^{256}$ independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo-[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is changed to a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine, and tris(methoxyethoxyethyl) amine. Examples of the aniline derivative having a hydroxyl group and/or an ether bond include N,N-bis(hydroxyethyl) aniline.

Other examples include at least one nitrogen-containing compound selected from a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$) CH$_2$O— or —CH$_2$CH$_2$CH$_2$O—) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)

$CH_2O$— or —$CH_2CH_2CH_2O$—) are preferred, and an oxyethylene group is more preferred.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20, in the case of a cycloalkylsulfonic acid ester, the cycloalkyl group preferably has a carbon number of 3 to 20, and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The amine compound having a phenoxy group can be obtained by reacting a primary or secondary amine having a phenoxy group with a haloalkyl ether under heating, adding an aqueous solution of strong base such as sodium hydroxide, potassium hydroxide and tetraalkylammonium, and performing extraction with an organic solvent such as ethyl acetate and chloroform, or by reacting a primary or secondary amine with a haloalkyl ether having a phenoxy group at the terminal under heating, adding an aqueous solution of strong base such as sodium hydroxide, potassium hydroxide and tetraalkylammonium, and performing extraction with an organic solvent such as ethyl acetate and chloroform.

One of these basic compounds may be used alone, or two or more thereof may be used in combination. However, when the amount of the acid-decomposable resin used is 0.05 mass % or more, a basic substance may or may not be used. In the case of using a basic compound, the amount thereof is usually from 0.001 to 10 mass %, preferably from 0.01 to 5 mass %, based on the solid content of the positive resist composition. The amount used is preferably 0.001 mass % or more for obtaining a sufficiently high addition effect and preferably 10 mass % or less in view of sensitivity and developability of the unexposed area.

Fluorine-Containing and/or Silicon-Containing Surfactants:

The positive resist composition of the present invention preferably further contains any one of fluorine-containing and/or silicon-containing surfactants (a fluorine-containing surfactant, a silicon-containing surfactant, and a surfactant containing both a fluorine atom and a silicon atom), or two or more thereof.

By incorporating the fluorine-containing and/or silicon-containing surfactant into the positive resist composition of the present invention, a resist pattern with good sensitivity, resolution and adherence as well as less development defect can be obtained when using an exposure light source of 250 nm or less, particularly 220 nm or less.

Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with a (poly(oxyethylene))acrylate (or methacrylate) and a (poly(oxypropylene))acrylate (or methacrylate), a copolymer of a $C_8F_{17}$ group-containing acrylate (or methacrylate) with a (poly(oxyalkylene))acrylate (or methacrylate), and a copolymer of a $C_8F_{17}$ group-containing acrylate (or methacrylate) with a (poly(oxyethylene))acrylate (or methacrylate) and a (poly(oxypropylene))acrylate (or methacrylate).

The amount of the fluorine-containing and/or silicon-containing surfactants used is preferably from 0.0001 to 2 mass %, more preferably from 0.001 to 1 mass %, based on the entire amount of the positive resist composition (excluding the solvent).

Organic Solvent:

The positive resist composition of the present invention is used by dissolving the components described above in a predetermined organic solvent.

Examples of the solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In particular, a mixed solvent of propylene glycol monomethyl ether and propylene glycol monomethyl ether acetate is preferred. The mixing ratio (by mass) of propylene glycol monomethyl ether to propylene glycol monomethyl ether acetate can be appropriately selected but is preferably from 90/10 to 10/90, more preferably from 85/15 to 15/85.

(Ia) Ketone-Based Solvent

As for the solvent used in the present invention, using a solvent having at least one ketone structure is also preferred embodiment.

The solvent having a ketone structure include a chain ketone solvent and a cyclic ketone solvent, and a compound having a total carbon umber of 5 to 8 is preferred because of good coatability.

Examples of the chain ketone solvent include 2-heptanone, methyl ethyl ketone and methyl isobutyl ketone, with 2-heptanone being preferred.

Examples of the cyclic ketone solvent include cyclopentanone, 3-methyl-2-cyclopentanone, cyclohexanone, 2-methylcyclohexanone, 2,6-dimethylcyclohexanone, cycloheptanone, cyclooctanone and isophorone, with cyclohexanone and cycloheptanone being preferred.

The solvent may be the ketone structure-containing solvent alone or may be a mixed solvent with other solvents. Examples of the solvent mixed (solvent used in combination) include a propylene glycol monoalkyl ether carboxylate, an alkyl lactate, a propylene glycol monoalkyl ether, an alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

The solvent used in combination is preferably a propylene glycol monoalkyl ether carboxylate, an alkyl lactate or a propylene glycol monoalkyl ether, more preferably propylene glycol monomethyl ether acetate.

By mixing the ketone-based solvent and the solvent used in combination, the adhesion to substrate, the developability, DOF and the like are improved.

The ratio (by mass) of the ketone-based solvent to the solvent used in combination is preferably from 10/90 to 95/5, more preferably from 20/80 to 80/20, still more preferably from 30/70 to 70/30.

Also, from the standpoint of enhancing the film thickness uniformity or the performance in terms of development defect, a high boiling point solvent having a boiling point of 200° C. or more, such as ethylene carbonate and propylene carbonate, may be mixed.

The amount of the high boiling point solvent added is usually from 0.1 to 15 mass %, preferably from 0.5 to 10 mass %, more preferably from 1 to 5 mass %, based on the entire solvent.

From the standpoint of enhancing the resolution, the positive resist composition of the present invention is preferably used in a film thickness of 30 to 250 nm, more preferably from 30 to 100 nm.

In the present invention, one solvent may be used alone, or two or more kinds of solvents may be used.

The solid content concentration is from 2.5 to 4.5 mass %, preferably from 3.0 to 4.0 mass %, and in this range, the object of the present invention can be achieved.

The solid content concentration of 2.5 to 4.5 mass % may be attained by weighing the masses of the solvent and all other components with good precision.

Other Additives:

The positive resist composition of the present invention may further contain, for example, a dye, a plasticizer, a surfactant other than the fluorine- and/or silicon-containing surfactant above, a photosensitizer, and a compound capable of accelerating solubility in a developer, if desired.

The compound capable of accelerating the dissolution in a developer, which can be used in the present invention, is a low molecular compound containing two or more phenolic OH groups or one or more carboxy groups and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the acid-decomposable resin or the alkali-soluble resin. The amount added is preferably 50 mass % or less from the standpoint of suppressing the development scum or preventing the deformation of pattern at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than the fluorine-containing and/or silicon-containing surfactants above may also be added. Specific examples thereof include a nonionic surfactant such as polyoxyethylene alkyl ethers, polyoxyethylene alkylallyl ethers, polyoxyethylene●polyoxypropylene block copolymers, sorbitan aliphatic esters, and polyoxyethylene sorbitan aliphatic esters.

One of these surfactants may be added alone, or several members thereof may be added in combination.

Pattern Forming Method:

The positive resist composition of the present invention is used by dissolving the above-described components in a predetermined organic solvent, preferably in the mixed solvent above, and coating the solution on a predetermined support as follows.

For example, the positive resist composition is coated on such a substrate (e.g., silicon/silicon dioxide-coated substrate) as used in the production of a precision integrated circuit device, by an appropriate coating method such as spinner or coater, and dried to form a resist film. Incidentally, a known antireflection film may also be previously provided.

The resist film is irradiated with an electron beam, X-ray or EUV through a predetermined mask, then preferably baked (heated), and developed, whereby a good pattern can be obtained.

The rotation number at the spin coating is preferably from 800 to 2,500 rpm, more preferably from 1,000 to 2,000 rpm, still more preferably from 1,200 to 1,600 rpm.

In the development step, an alkali developer is used as follows. The alkali developer which can be used for the resist composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

Synthesis Example 1

Synthesis of Compound (A-1)

In a 500 mL-volume three-neck flask equipped with a 300-mL dropping funnel and a nitrogen inlet tube, propane-1,3-disulfonyl difluoride ((47.4 mmol)) is charged, then dissolved in 150 mL of THF in a nitrogen atmosphere and stirred under ice cooling. Subsequently, 100 mL of a THF solution containing 4-piperidinopiperidine (47.4 mmol) and triethylamine (47.4 mmol) is added dropwise through the dropping funnel over 1 hour. Following the dropwise addition, the mixed solution is stirred under ice cooling for 1 hour and after removing the ice bath, further stirred at room temperature for 4 hours. Thereafter, 200 mL of AcOEt and 100 mL of water are added to the reaction solution, and the precipitated solid is filtered and then washed with acetone to obtain a white solid having the following structure. This solid is stirred in a mixed solvent containing 300 mL of MeOH and 50 mL of an aqueous 1M-sodium hydroxide solution at room temperature for 1 hour, and thereto, triphenylsulfonium bromide (24 mmol) is added and stirred at room temperature for 3 hours. Furthermore, 200 mL of chloroform is added, and the organic layer is washed with water several times, then concentrated and vacuum-dried to obtain the objective solid.

Synthesis Example 2

Synthesis of Compound (A-39)

Triphenylsulfonium bromide (46.9 mmol) and silver oxide (53.5 mmol) are added to 150 mL of methanol and stirred at room temperature for 2 hours. The silver salt is removed by filtration, and N,N-bis(2-hydroxyethyl)-2-aminoethanesulfonic acid (46.9 mmol) is added to the filtrate and further stirred for 1 hour. Subsequently, the solvent is removed and dried to obtain the objective white solid.

Other compounds are synthesized in the same manner.

Synthesis Example 3

Synthesis of Resin (RB-19)

p-Acetoxystyrene and (4'-hydroxyphenyl)methacrylate are charged at a ratio of 60/40 (mole fraction) and dissolved in tetrahydrofuran to prepare 100 mL of a solution having a solid content concentration of 20 mass %. To this solution, 3 mol % of methyl mercaptopropionate and 4 mol % of a polymerization initiator, V-65, produced by Wako Pure Chemical Industries, Ltd. are added, and the resulting solution is added dropwise to 10 mL of tetrahydrofuran heated to 60° C., over 4 hours in a nitrogen atmosphere. After the completion of dropwise addition, the reaction solution is heated for 4 hours, and 1 mol % of V-65 is again added, followed by stirring for 4 hours. When the reaction is completed, the reaction solution is cooled to room temperature and after crystallization in 3 L of hexane, the precipitated white powder is collected by filtration.

The compositional ratio of the polymer determined from $C^{13}$NMR is 58/42. Also, the weight average molecular weight determined by GPC is 2,200 in terms of standard polystyrene, and the polydispersity (Mw/Mn) is 1.30.

The resin obtained is vacuum-dried and then dissolved in 100 ml of dehydrated THF (tetrahydrofuran), and 10 ml of cyclohexyl vinyl ether is added thereto. While stirring the resulting solution, 100 mg of p-toluenesulfonic acid is added, and the reaction is allowed to proceed for 3 hours. The reaction solution is neutralized by adding 1 ml of triethylamine, and then, liquid separation and washing are repeated three times by adding 200 ml of ethyl acetate and further adding 500 ml of distilled water. The ethyl acetate layer is reprecipitated from hexane to obtain the objective resin RB-19 (compositional molar ratio: 43/15/32/10, weight average molecular weight: 2,500, polydispersity: 1.30). The glass transition temperature of the resin is measured by DSC and found to be 110° C.

Other resins are synthesized by the same method.

<Acid-Decomposable Resin>

The structure, molecular weight and polydispersity of each of acid-decomposable resins used in Examples are shown below.

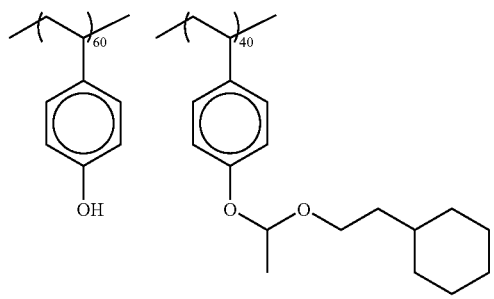

(RB-1)

Mw 10000
Mw/Mn 1.4

-continued
(RB-2)
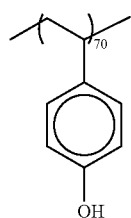
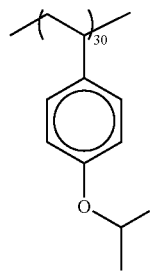
Mw 1500
Mw/Mn 1.4
(RB-3)
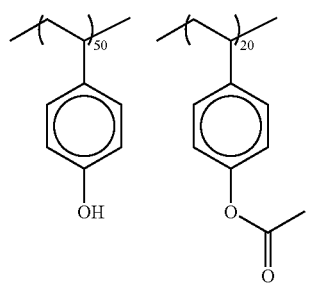
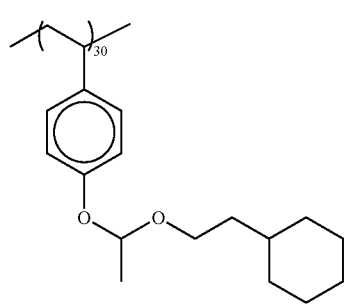
Mw 2000
Mw/Mn 1.4
(RB-4)
-continued
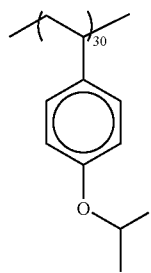
Mw 15000
Mw/Mn 1.4
(RB-5)
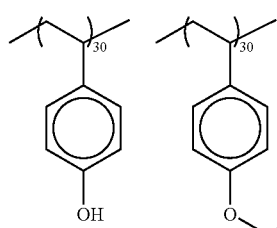
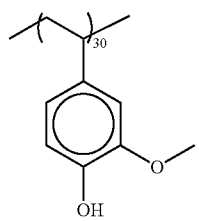
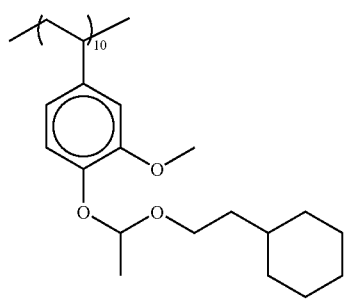
Mw 8000
Mw/Mn 1.4
(RB-6)
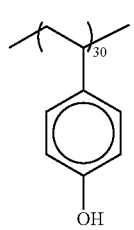
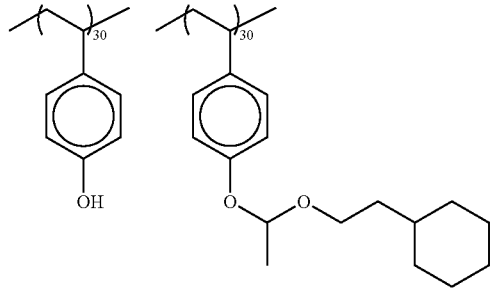

-continued
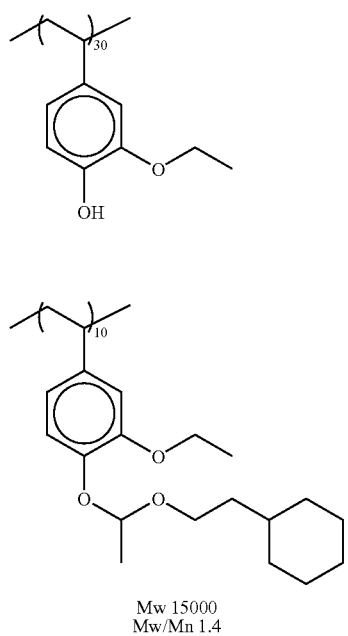
Mw 15000
Mw/Mn 1.4
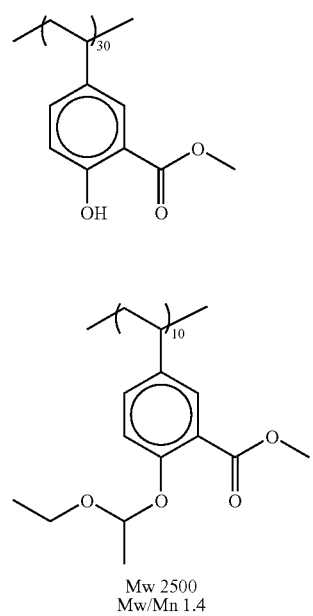
Mw 2500
Mw/Mn 1.4
-continued
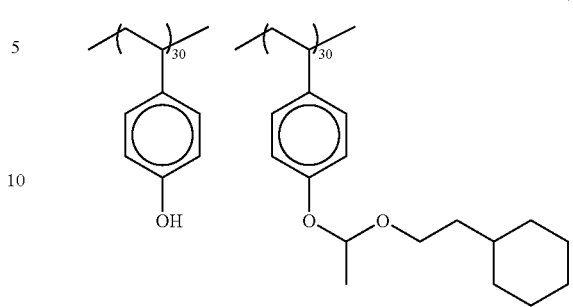 (RB-8)
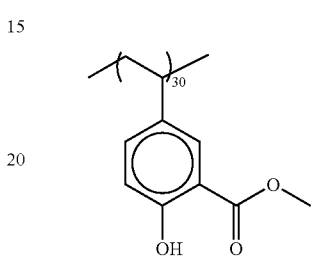
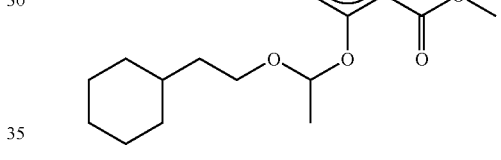
Mw 2500
Mw/Mn 1.4
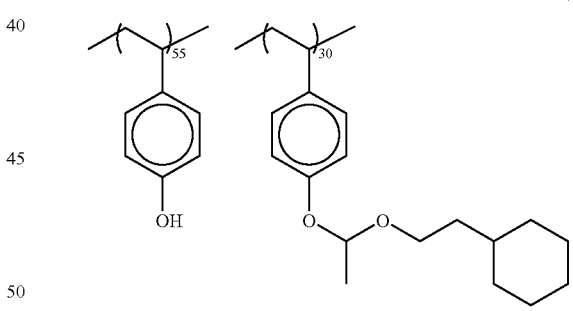 (RB-9)
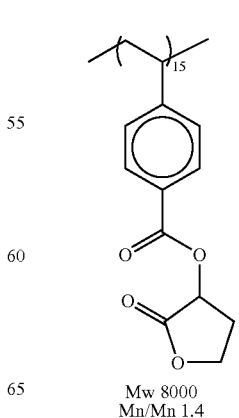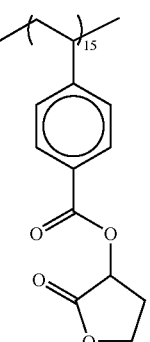
Mw 8000
Mn/Mn 1.4
(RB-7)

-continued
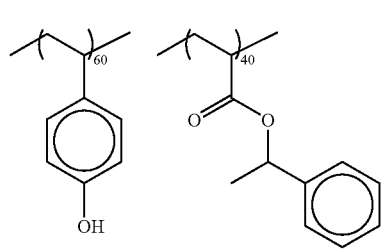
(RB-10)
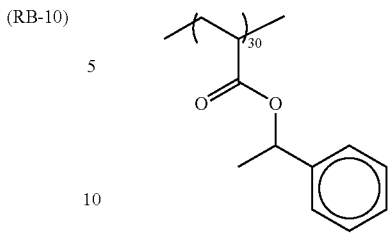
Mw 8000
Mw/Mn 1.4
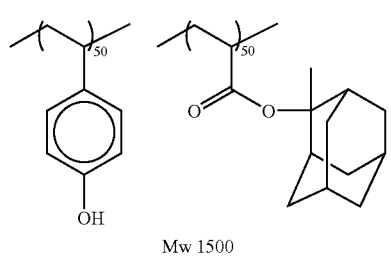
(RB-11)
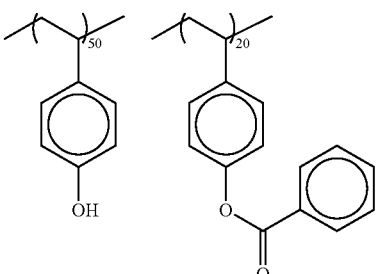
(RB-14)
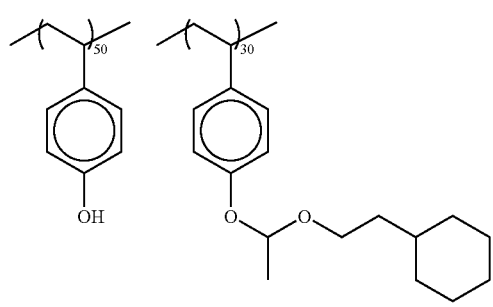
(RB-12)
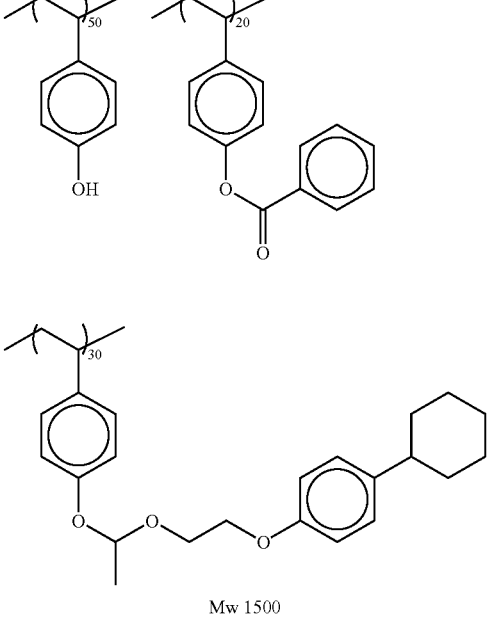
Mw 1500
Mw/Mn 1.4
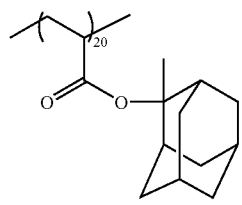
Mw 8000
Mw/Mn 1.4
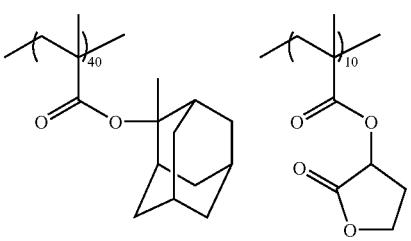
(RB-15)
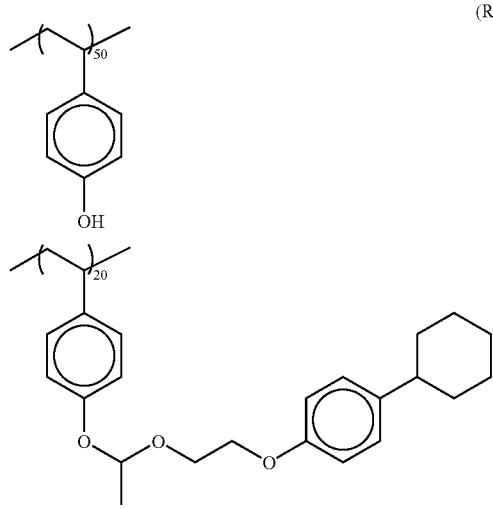
(RB-13)
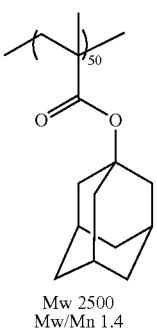
Mw 2500
Mw/Mn 1.4

-continued (RB-16)

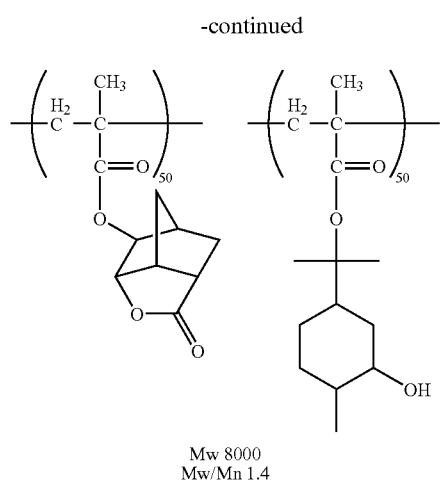

Mw 8000
Mw/Mn 1.4

(RB-17)

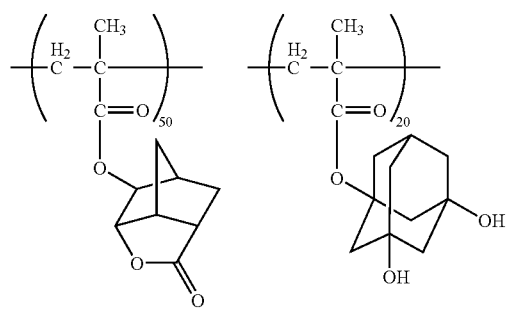

Mw 2500
Mw/Mn 1.4

(RB-18)

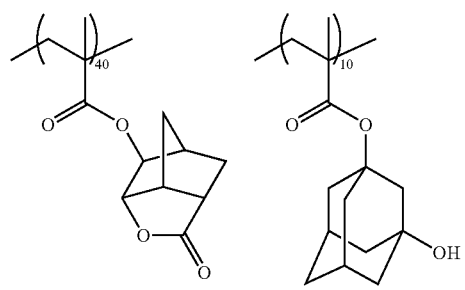

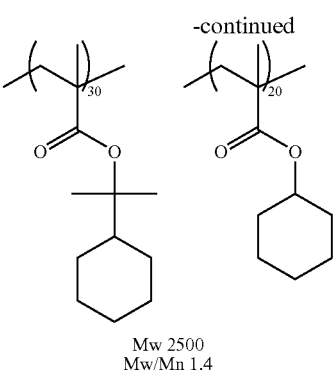

Mw 2500
Mw/Mn 1.4

(RB-19)

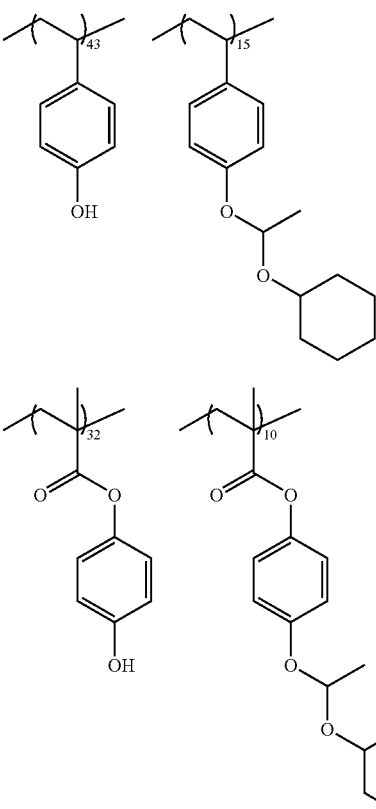

Mw: 2500
Mw/Mn: 1.30

Examples 1 to 16 and Comparative Examples 1 to 6

The components shown in Table 1 below are dissolved in a 8/2 (by mass) mixed solvent of PGMEA (propylene glycol monomethyl ether acetate)/PGME (propylene glycol monomethyl ether), the obtained solution is filtered through a polytetrafluoroethylene filter having a pore size of 0.1 μm to prepare a positive resist solution having a solid content concentration shown in Table 1, and the evaluation is performed as follows. The mass % of each component in Table 1 is based on the entire solid content.

Separately from the components shown in Table 1, polyoxyethylene lauryl ether is added as a surfactant in an amount of 0.1 mass % based on the entire solid content.

<Evaluation of Resist>

The positive resist solution prepared above is uniformly coated on a 12-inch hexamethyldisilazane-treated silicon substrate by using a spin coater at a rotation speed of 1,250 rpm and dried under heating on a hot plate at 120° C. for 60 seconds to form a resist film having a thickness of 60 nm.

The obtained resist film is subjected to surface exposure by using EUV (wavelength: 13 nm) while changing the exposure amount in steps of 1 mJ/cm$^2$ in the range of 0 to 35 mJ/cm$^2$ and further baked at 110° C. for 90 seconds. Thereafter, the resist film is developed with an aqueous 2.38 mass % tetramethylammonium hydroxide (TMAH) solution and the dissolution rate at each exposure amount is measured to obtain a dissolution rate curve. In the dissolution rate curve, the minimum exposure amount required to allow complete dissolution of the resist film in a development time of 60 seconds is defined as Eth sensitivity.

The same evaluation is performed after storing the resist composition at 4° C. for 3 months.

The evaluation results are shown in Table 1.

TABLE 1

| | Compound (A) of Comparative Example (mass %) | Acid Generator (8.0 mass %) | Resin (90.5 mass %) | Solid Content Concentration (mass %) | Eth Sensitivity (immediately after preparation) (mJ/cm$^2$) | Eth Sensitivity (after storage at 4° C. for 3 months) (mJ/cm$^2$) |
|---|---|---|---|---|---|---|
| Example 1 | A-4 (0.75), N-1 (0.75) | z2 | RB-1 | 3.0 | 14.3 | 14.4 |
| Example 2 | A-1 (0.75), N-1 (0.75) | z12 | RB-19 | 3.5 | 15.4 | 15.4 |
| Example 3 | A-31 (0.75), N-1 (0.75) | z12 | RB-4 | 4.5 | 14.6 | 14.8 |
| Example 4 | A-37 (0.75), N-1 (0.75) | z18 | RB-6 | 2.5 | 15.8 | 16.0 |
| Example 5 | A-39 (0.75), N-1 (0.75) | z35 | RB-11 | 3.0 | 15.3 | 15.4 |
| Example 6 | A-43 (0.75), N-1 (0.75) | z69 | RB-10 | 2.5 | 14.4 | 14.4 |
| Example 7 | A-47 (0.75), N-1 (0.75) | z65 | RB-15 | 3.0 | 14.7 | 15.0 |
| Example 8 | A-52 (0.75), N-1 (0.75) | z60 | RB-10 | 4.0 | 14.6 | 14.9 |
| Example 9 | A-23 (0.75), N-1 (0.75) | z67 | RB-1 | 4.0 | 15.0 | 15.3 |
| Example 10 | A-5 (0.75), N-1 (0.75) | z12 | RB-19 | 3.5 | 13.8 | 13.9 |
| Example 11 | A-7 (0.75), N-1 (0.75) | z2 | RB-19 | 3.5 | 14.1 | 14.1 |
| Example 12 | A-20 (0.75), N-1 (0.75) | z34 | RB-1 | 3.5 | 13.6 | 13.6 |
| Example 13 | A-27 (0.75), N-1 (0.75) | z55 | RB-15 | 3.5 | 14.3 | 14.4 |
| Example 14 | A-57 (0.75), N-1 (0.75) | z68 | RB-10 | 3.5 | 13.3 | 13.3 |
| Example 15 | A-70 (0.75), N-1 (0.75) | z68 | RB-4 | 3.5 | 13.2 | 13.2 |
| Example 16 | A-74 (0.75), N-1 (0.75) | z12 | RB-6 | 3.0 | 14.9 | 15.0 |
| Comparative Example 1 | A-4 (0.75), N-1 (0.75) | z2 | RB-1 | 2.0 | 14.4 | 15.9 |
| Comparative Example 2 | A-4 (0.75), N-1 (0.75) | z2 | RB-1 | 5.0 | 14.4 | 16.3 |
| Comparative Example 3 | N-1 (1.5) | z2 | RB-1 | 3.0 | 18.2 | 22.4 |
| Comparative Example 4 | N-1 (1.5) | z2 | RB-10 | 3.0 | 19.1 | 22.2 |
| Comparative Example 5 | N-1 (1.5) | z2 | RB-1 | 2.0 | 18.5 | 23.1 |
| Comparative Example 6 | N-1 (1.5) | z2 | RB-1 | 5.0 | 18.8 | 23.2 |

N-1: Trioctylamine

As seen from the results in Table 1, in the characteristic evaluation by the irradiation with EUV light, the positive resist composition of the present invention is excellent in the aging stability as compared with the composition of Comparative Examples.

In Examples, only EUV exposure is performed, but it is seen from Examples that the same effects are obtained also when exposed with electron beam and X-ray.

According to the present invention, in the fine processing of a semiconductor device, where electron beam, X-ray or EUV is used, a positive resist composition with good aging stability and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition for electron beam, X-ray or EUV, comprising:

a compound having a proton acceptor functional group and capable of producing an acid radical upon irradiation with an actinic ray or radiation to reduce or lose the acceptor property or to change the proton acceptor functional group to be acidic, wherein the positive resist composition has a solid content concentration of from 2.5 to 4.5 mass %.

2. The positive resist composition for electron beam, X-ray or EUV as claimed in claim 1, wherein said compound is a compound capable of generating an organic acid represented by the following formula (I) upon irradiation with an actinic ray or radiation:

HO3S-A-(X)n—B—R  (I)

wherein

A represents a divalent linking group,

X represents —SO2- or —CO—, n represents 0 or 1,

B represents a single bond, an oxygen atom or N(Rx)—,

Rx represents a hydrogen atom or a monovalent organic group,

R represents a monovalent organic group containing a proton acceptor functional group, or a monovalent organic group containing an ammonium group, and when B is —N(Rx)—, R and Rx may combine to form a ring.

3. The positive resist composition for electron beam, X-ray or EUV as claimed in claim 1, further comprising:
a resin capable of decomposing by the action of an acid to increase the solubility in an alkali developer.

4. A pattern forming method comprising:
forming a resist film from the positive resist composition claimed in claim 1,
exposing said resist film with an electron beam, X-ray or EUV, and
developing said resist film.

5. The positive resist composition for electron beam, X-ray or EUV as claimed in claim 3, wherein the resin capable of decomposing by the action of an acid to increase the solubility in an alkali developer has a hydroxystyrene repeating unit.

6. The positive resist composition for electron beam, X-ray or EUV as claimed in claim 5, wherein the resin capable of decomposing by the action of an acid to increase the solubility in an alkali developer has a repeating unit represented by formula (II) and a repeating unit represented by formula (III):

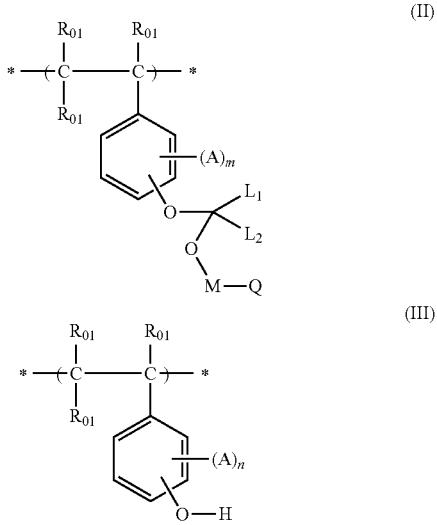

wherein,
each $R_{01}$ independently represents a hydrogen atom, an alkyl group, a cycloalkyl group, a halogen atom, a cyano group or an alkoxycarbonyl group;
each of $L_1$ and $L_2$, which may be the same or different, represents a hydrogen atom, an alkyl group, a cycloalkyl group or an aralkyl group;
M represents a single bond or a divalent linking group;
Q represents an alkyl group, a cycloalkyl group or an alicyclic or aromatic ring group which may contain a heteroatom;
A represents a halogen atom, a cyano group, an acyl group, an alkyl group, an alkoxy group, an acyloxy group or an alkoxycarbonyl group;
at least two members out of Q, M and $L_1$ may combine to form a 5- or 6-membered ring; and
each of m and n represents an integer of 0 to 4.

7. The positive resist composition for electron beam, X-ray or EUV as claimed in claim 5, wherein the resin capable of decomposing by the action of an acid to increase the solubility in an alkali developer has a repeating unit represented by formula (V):

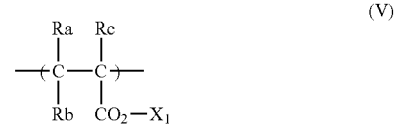

wherein,
each of Ra, Rb, and Rc independently represents a hydrogen atom, a fluorine atom, a chlorine atom, a cyano group or an alkyl group; and
$X_1$ represents a hydrogen atom or an organic group.

8. The positive resist composition for electron beam, X-ray or EUV as claimed in claim 7, wherein $X_1$ represents an acid decomposable group.

9. The positive resist composition for electron beam, X-ray or EUV as claimed in claim 3, wherein a weight average molecular weight of the resin capable of decomposing by the action of an acid to increase the solubility in an alkali developer is 5,000 or less.

10. The positive resist composition for electron beam, X-ray or EUV as claimed in claim 1, wherein the partial structure of the proton acceptor functional group is selected from the group consisting of crown ether, aza-crown ether, tertiary amine, secondary amine, primary amine, pyridine, imidazole and pyrazine structures.

11. The positive resist composition for electron beam, X-ray or EUV as claimed in claim 2, wherein the partial structure of the proton acceptor functional group is selected from the group consisting of crown ether, aza-crown ether, tertiary amine, secondary amine, primary amine, pyridine, imidazole and pyrazine structures.

12. The positive resist composition for electron beam, X-ray or EUV as claimed in claim 1, wherein the compound having a proton acceptor functional group and capable of producing an acid radical upon irradiation with an actinic ray or radiation to reduce or lose the acceptor property or to change the proton acceptor functional group to be acidic is a compound represented by formula (A3):

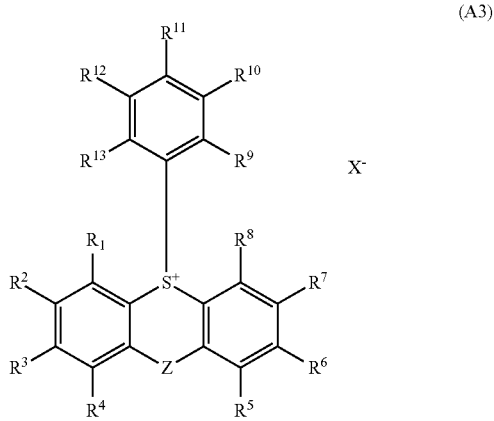

wherein, each of $R^1$ to $R^{13}$ independently represents a hydrogen atom or a substituent, and at least one of $R^1$ to $R^{13}$ is a substituent containing an alcoholic hydroxyl group;

Z represents a single bond or a divalent linking group; and $X^-$ represents an anion containing a proton acceptor functional group.

13. The positive resist composition for electron beam, X-ray or EUV as claimed in claim 1, wherein the positive resist composition further comprises a compound capable of generating an acid upon irradiation with an actinic ray or radiation.

* * * * *